US011211349B2

(12) United States Patent
Isozaki et al.

(10) Patent No.: US 11,211,349 B2
(45) Date of Patent: Dec. 28, 2021

(54) SEMICONDUCTOR DEVICE INCLUDING A PLURALITY OF BONDING PADS

(71) Applicant: RENESAS ELECTRONICS CORPORATION, Tokyo (JP)

(72) Inventors: Seiya Isozaki, Tokyo (JP); Tatsuya Kobayashi, Tokyo (JP); Kota Jinno, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/910,225

(22) Filed: Jun. 24, 2020

(65) Prior Publication Data
US 2021/0057361 A1     Feb. 25, 2021

(30) Foreign Application Priority Data
Aug. 22, 2019   (JP) .............................. JP2019-151900

(51) Int. Cl.
*H01L 23/00*       (2006.01)
*H01L 21/66*       (2006.01)
(Continued)

(52) U.S. Cl.
CPC .......... *H01L 24/05* (2013.01); *H01L 21/4825* (2013.01); *H01L 21/565* (2013.01);
(Continued)

(58) Field of Classification Search
CPC ..... H01L 24/05; H01L 22/32; H01L 23/3114; H01L 23/49513; H01L 23/4952; H01L 21/4825; H01L 21/78; H01L 24/48; H01L 21/565; H01L 2924/351; H01L 2224/04042; H01L 2224/05009; H01L 2224/48465; H01L 23/49555; H01L 24/42;
(Continued)

(56) References Cited

U.S. PATENT DOCUMENTS 8,896,129 B2    11/2014 Mori et al.
10,109,666 B2 * 10/2018 Cheng ............... H01L 27/14621
(Continued)

FOREIGN PATENT DOCUMENTS

JP   2009-170763 A    7/2009
JP   2013-206905 A   10/2013
WO  2017/145256 A1   8/2017

*Primary Examiner* — Mamadou L Diallo
(74) *Attorney, Agent, or Firm* — McDermott Will & Emery LLP

(57) ABSTRACT

A semiconductor device comprising: bonding pads formed in the first wiring layer; and first wirings and a second wiring formed in a second wiring layer provided one layer below the first wiring layer. Here, a power supply potential and a reference potential are to be supplied to each first wiring and the second wiring, respectively. Also, in transparent plan view, each of the first wirings is arranged next to each other, and is arranged at a first position of the second wiring layer, that is overlapped with the bonding region of the first bonding pad. Also, in transparent plan view, the second wiring is arranged at a second position of the second wiring layer, that is overlapped with a first region located between the first bonding pad and the second bonding pad. Further, a width of each first wiring is less than a width of the second wiring.

23 Claims, 16 Drawing Sheets

(51) Int. Cl.
  *H01L 23/31* (2006.01)
  *H01L 23/495* (2006.01)
  *H01L 21/48* (2006.01)
  *H01L 21/78* (2006.01)
  *H01L 21/56* (2006.01)

(52) U.S. Cl.
  CPC .............. *H01L 21/78* (2013.01); *H01L 22/32* (2013.01); *H01L 23/3114* (2013.01); *H01L 23/4952* (2013.01); *H01L 23/49513* (2013.01); *H01L 24/48* (2013.01); *H01L 2224/04042* (2013.01); *H01L 2224/05009* (2013.01); *H01L 2224/48465* (2013.01); *H01L 2924/351* (2013.01)

(58) Field of Classification Search
  CPC .............. H01L 23/3107; H01L 23/5221; H01L 23/5283; H01L 23/5228; H01L 23/562; H01L 23/5226; H01L 23/535; H01L 24/08; H01L 24/03; H01L 24/46; H01L 24/49; H01L 24/43; H01L 24/85; H01L 21/768; H01L 2224/05; H01L 2224/05553; H01L 2224/32014; H01L 2224/48227; H01L 2224/4912; H01L 2224/73265; H01L 2224/85207; H01L 2924/3011; H01L 2924/37001
  See application file for complete search history.

(56) References Cited

U.S. PATENT DOCUMENTS

| | | | |
|---|---|---|---|
| 2008/0217786 A1* | 9/2008 | Kasaoka | G03F 1/32 257/773 |
| 2009/0184424 A1 | 7/2009 | Furusawa et al. | |
| 2015/0340400 A1* | 11/2015 | Takemoto | H01L 24/05 257/448 |
| 2018/0122741 A1* | 5/2018 | Cho | H01L 23/5227 |
| 2018/0286911 A1* | 10/2018 | Kagawa | H01L 27/14632 |
| 2018/0374795 A1* | 12/2018 | Deguchi | H01L 21/768 |

* cited by examiner

SEMICONDUCTOR DEVICE INCLUDING A PLURALITY OF BONDING PADS

CROSS-REFERENCE TO RELATED APPLICATIONS

The disclosure of Japanese Patent Application No. 2019-151900 filed on Aug. 22, 2019 including the specification, drawings and abstract is incorporated herein by reference in its entirety.

BACKGROUND

The present invention relates to semiconductor device, for example, to a technique valuable for a semiconductor device comprising a plurality of bonding pads including a supply path of a power supply potential and a supply path of a reference potential.

There are disclosed techniques listed below.
[Patent Document 1] Japanese Unexamined Patent Application Publication No. 2009-170763
[Patent Document 2] Japanese Unexamined Patent Application Publication No. 2013-206905
[Patent Document 3] WO 2017/145256

Patent Document 1, Patent Document 2 and Patent Document 3 describe a semiconductor device in which a plurality of wires is provided directly below the bonding pad.

SUMMARY

In recent years, a circuit formed in a semiconductor device carries out the transmission of a variety of electronic signals in accordance with the higher performance of the semiconductor device. In addition, a power consumption of the circuit is also increased in accordance with the higher speed of the transmission speed of the electric signals and the higher processing speed of the circuit. In such a semiconductor device, a supply path of a reference potential serves a variety of functions. The supply path of the reference potential may serve, for example, as a path to reduce a noise component contained in various wiring paths (i.e., return path of signal transmission path), or as an electromagnetic shielding to suppress the propagation of electromagnetic noise from inside or outside of the semiconductor device. In order to improve the above-mentioned functions served by the supply path of the reference potential, it is desirable to reduce an impedance of the supply path of the reference potential.

Other objects and novel features will become apparent from the description of this specification and the accompanying drawings.

A semiconductor device according to one embodiment comprising: a plurality of bonding pads formed in the first wiring layer; a plurality of first wirings formed in a second wiring layer provided one layer below the first wiring layer; and one or more second wirings formed in the second wiring layer. Here, a power supply potential is to be supplied to each of the plurality of first wirings. Also, a reference potential is to be supplied to the one or more second wirings. Also, in transparent plan view, each of the first wirings is arranged next to each other, and is arranged at a first position of the second wiring layer, that is overlapped with the bonding region of the first bonding pad. Also, in transparent plan view, the one or more second wirings are arranged such that the one or more second wirings are extended along one of the plurality of first wirings at a second position of the second wiring layer, that is overlapped with a first region located between the first bonding pad and the second bonding pad. Further, a width of each of the plurality of first wirings is less than a width of the one or more second wirings.

DETAILED DESCRIPTION

Figure 1:
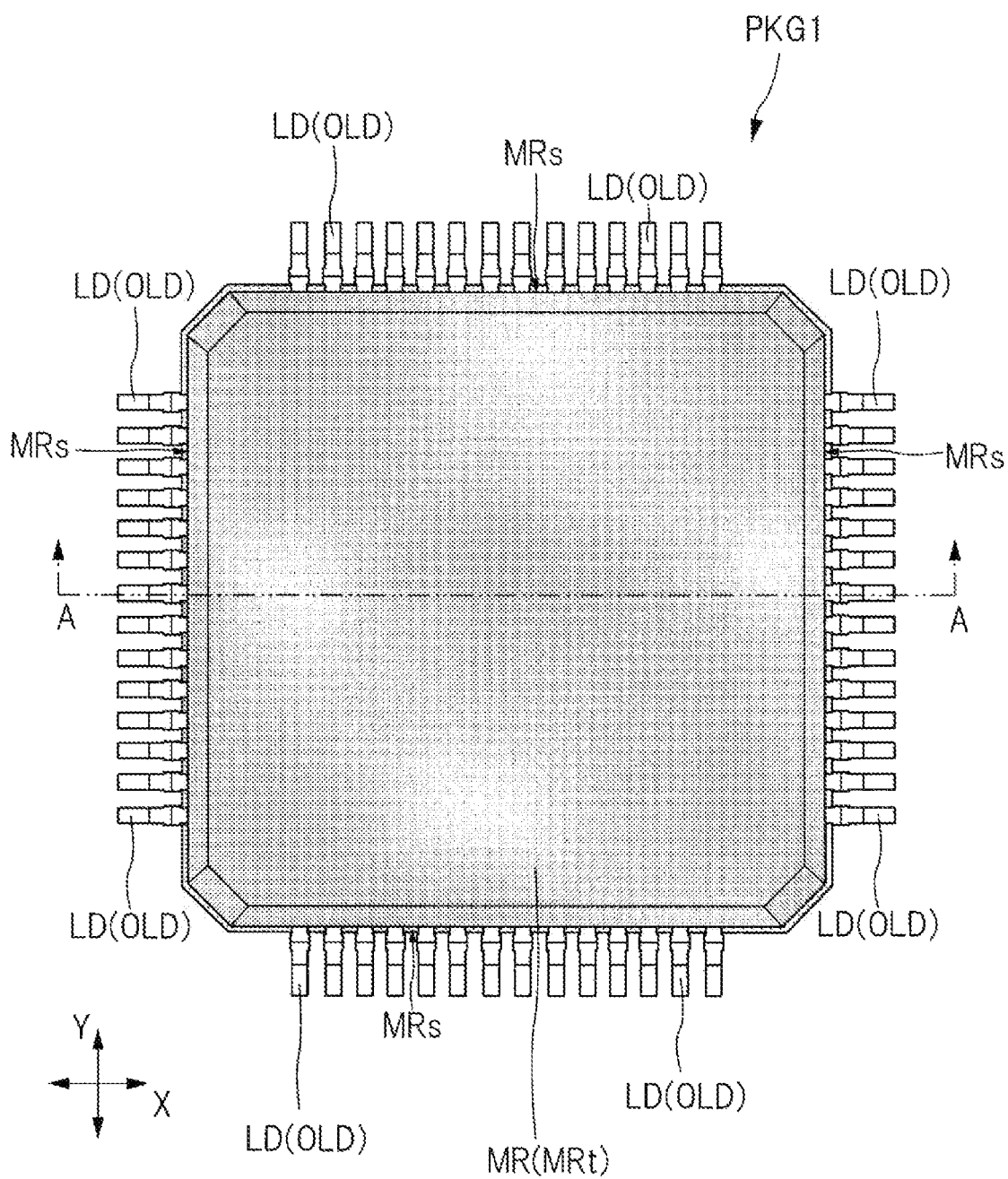
FIG. 1 is a top view of a semiconductor package according to one embodiment.

<Explanation of Description Form, Basic Term and Usage in Present Application)

In the present application, the description of the embodiment will be divided into a plurality of sections or the like as required for convenience, but unless expressly stated otherwise, these are not independent of each other, and each part of a single example, one of which is a partial detail or a part or all of the other, whether before or after the description, or the like, is modified example or the like. In principle, descriptions of similar parts are omitted. Also, each component in an embodiment is not essential, unless expressly stated otherwise, theoretically limited to that number, and obviously otherwise from the context.

Similarly, in the description of the embodiment and the like, "X consisting of A" or the like with respect to the material, composition, and the like does not exclude elements other than A, except when it is clearly indicated that this is not the case and when it is obvious from the context that this is not the case. For example, regarding a component, it means "X including A as a main component" or the like. For example, the term "silicon member" or the like is not limited to pure silicon, and it is needless to say that it also includes a member containing a SiGe (silicon-germanium) alloy, a multi-element alloy containing silicon as its main component, other additives, or the like. In addition, the gold plating, Cu layer, nickel plating, and the like include not only pure materials, but also members containing gold, Cu, nickel, and the like as main components, respectively, unless otherwise specified.

In addition, reference to a specific numerical value or quantity may be greater than or less than that specific numerical value, unless expressly stated otherwise, theoretically limited to that number, and obviously not so from the context. In the following description, a certain value and another value may be referred to as "the same" or "the same", but the meaning of "the same" or "the same" includes strictly the same cases as well as cases in which there is an error within a range that can be considered to be substantially equivalent.

In the drawings of the embodiments, the same or similar parts are denoted by the same or similar symbols or reference numerals, and the description will not be repeated in principle. In addition, in the attached drawings, hatching and the like may be omitted even in a cross-section when it becomes complicated or when it is clearly distinguished from a gap. In this connection, even if the hole is closed in plan, the outline of the background may be omitted when it is obvious from the description or the like. In addition, hatching or dot patterns may be added to indicate that the region is not a void, even if it is not a cross-section, or to indicate the boundary of the area.

In the present application, a construction that has a semiconductor substrate, and a plurality of wiring layers stacked on semiconductor substrate, and in that those bonding pads are formed on the uppermost layer of the plurality of wiring layers is referred to as "semiconductor chips". In addition, a structure in which a semiconductor chip is mounted on a substrate such as a wiring substrate or a lead frame and the bonding pads are electrically connected to an external terminal of the substrate is referred to as a "semiconductor package." It is also referred to as "semiconductor device" as a generic term for semiconductor chips and semiconductor packages. Therefore, when it is described as "semiconductor device", it may be a semiconductor chip, or a semiconductor package.

Further, "bonding pad" is an external terminal of the semiconductor chip, for example, a wire or a portion capable of bonding a conductive member such as a bump electrode. Of the bonding pads, in the exposed surface exposed from the insulating film covering the wiring layer of the uppermost layer, the wire as described above, or the region to be bonded conductive member such as bump electrode is referred to as a bonding region. Therefore, the "bonding region" includes a portion that may be joined due to affects such as mechanical accuracy when joining, in addition to the bonding surface after the conductive member is actually joined.

<Semiconductor Package>

Figure 2:
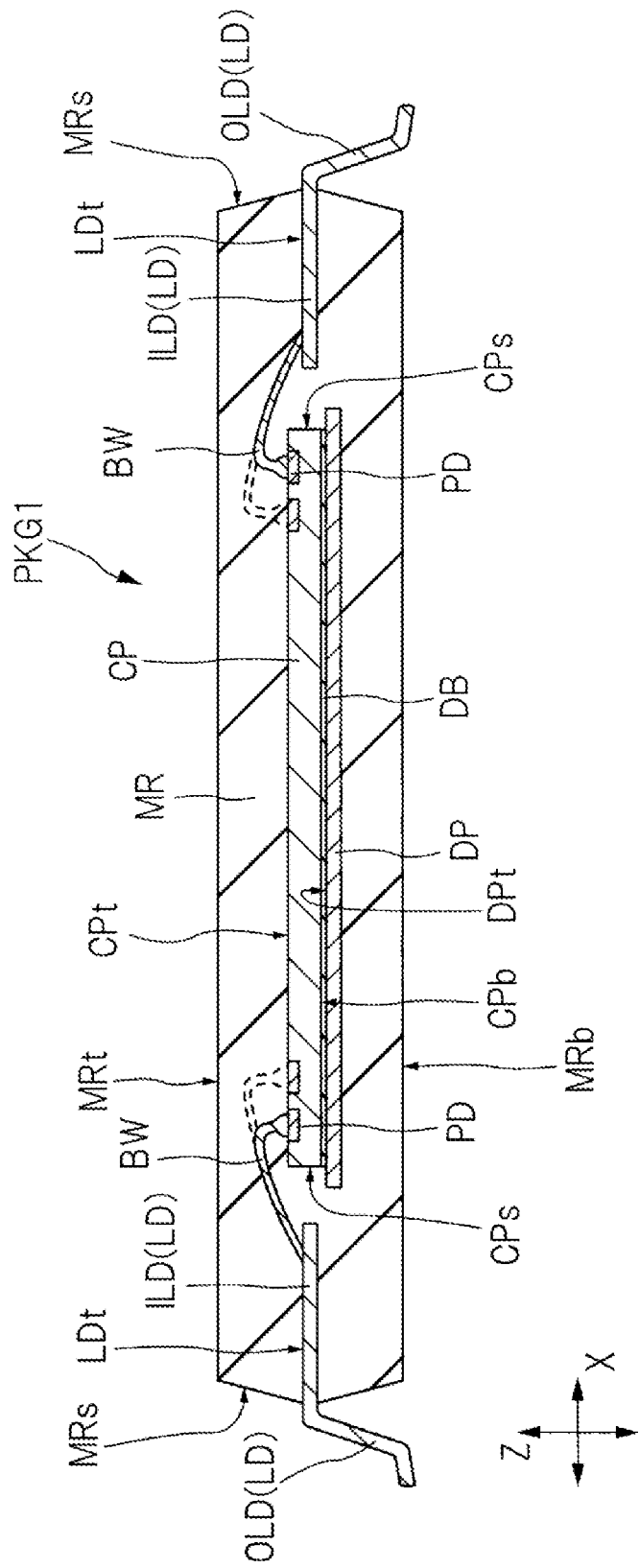
FIG. 2 is a cross-section view along A-A line of FIG. 1.

First, a configuration example of a semiconductor package PKG1 of the present embodiment will be described with reference to FIGS. 1 to 3. FIG. 1 is a top view of the semiconductor package according to the present embodiment. FIG. 2 is a cross-section view along A-A line of FIG. 1.

Hereinafter, as a configuration example of a semiconductor package, the wire is a metal wire is connected to the bonding pad exposed at the surface of the semiconductor chip, the lead and the bonding pad disposed around the semiconductor chip is connected via a wire, the semiconductor package of the lead frame type will be described. However, there are various modified example in the embodiment of packaging the semiconductor chip described below. For example, the semiconductor chip may be mounted on the wiring substrate rather than the lead frame. Further, for example, the bonding pads of the semiconductor chip is mounted on the wiring substrate so as to face the wiring substrate, the bonding pads may be electrically connected to the wiring substrate via the bump electrode.

Figure 3:
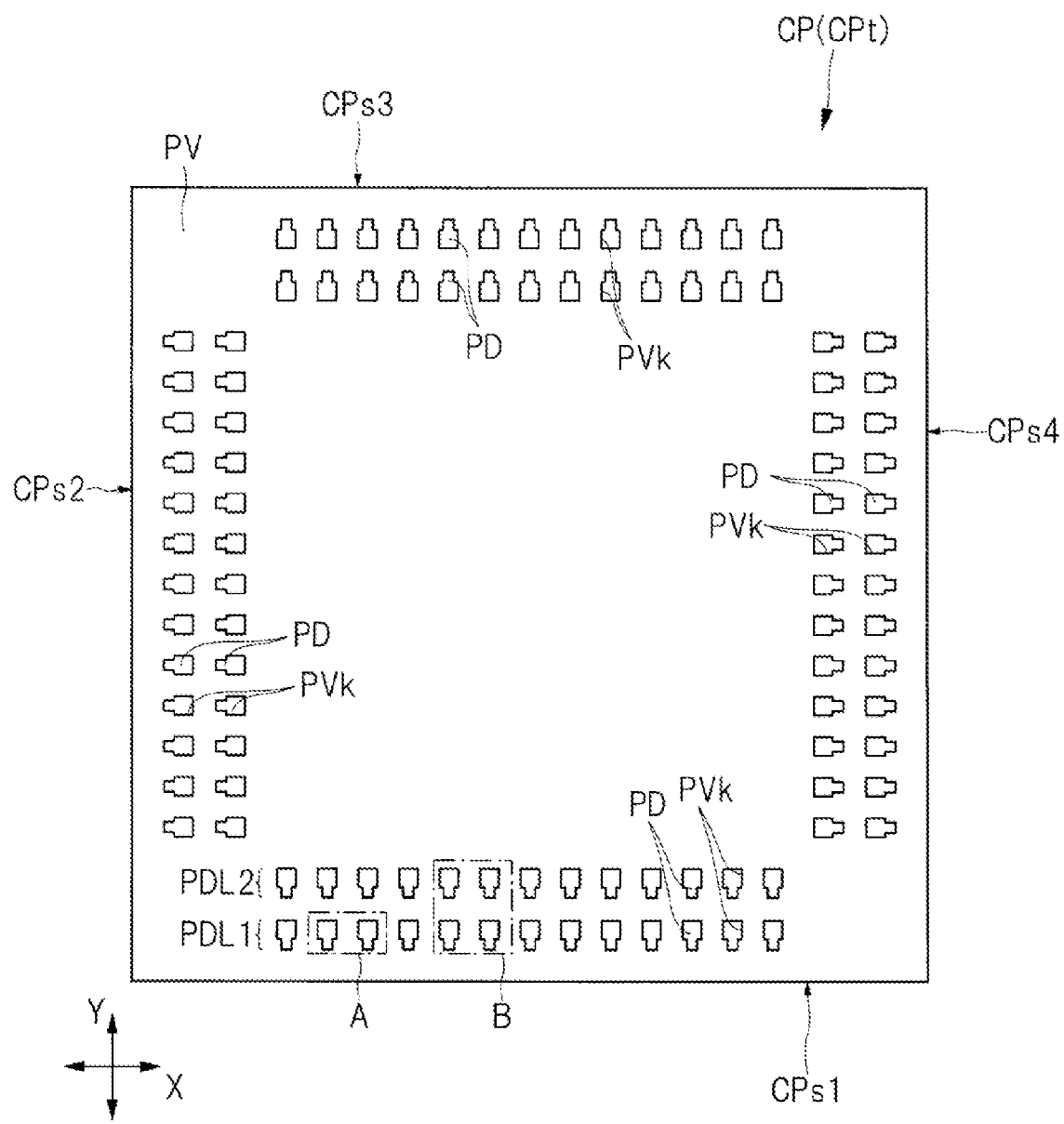
FIG. 3 is a plan view seen from a front surface of a semiconductor chip shown in FIG. 2.

As shown in FIGS. 1 to 3, the semiconductor package PKG1 includes a semiconductor chip CP (see FIGS. 2 and 3), a plurality of leads (terminals, external terminals) LD that is an external terminal disposed around the semiconductor chip CP, and a plurality of wires BW (see FIG. 2) that is a conductive member for electrically connecting the semiconductor chip CP with the plurality of leads LD. The semiconductor chip CP and the plurality of wires BW are sealed with a sealing body (resin body) MR. The inner lead portion ILD of each of the plurality of leads LD is sealed with the sealing body MR, and the outer lead portion OLD of each of the plurality of leads LD is exposed from the sealing body MR.

As shown in FIG. 1, a sealing body MR in plan view of the semiconductor package PKG1 has a rectangular shape. The sealing body MR includes an upper surface MRt, a lower surface opposite to the upper surface MRt (rear surface, mounted surface) MRb (see FIG. 2), a plurality of (four in FIG. 1) side surfaces MRs located between the upper surface MRt and the lower surface MRb.

Further, in the semiconductor package PKG1, a plurality of leads LD is arranged along each of the four sides of the sealing body MR comprised of the rectangular shape. The plurality of leads LDs are made of metal, and in the present embodiment, the leads LDs are metal members mainly composed of copper (Cu), for example. The semiconductor package in which a plurality of leads LD is arranged along each of the four sides of the sealing body MR, such as the present embodiment, is referred to as QFP (Quad Flat Package). Though not shown, semiconductor packages in which a plurality of leads LD are arranged along two sides located on opposing sides of four sides of the sealing body MR, and the leads LD are not arranged on the other two sides of the sealing body MR are called SOPs (Small Outline Package). The present embodiment exemplifies an embodiment applied to a semiconductor package PKG1 which is a QFP, but as described above, there are various modified example.

As shown in FIG. 2, the outer lead portions OLD of the plurality of leads LD project toward the outside of the sealing body MR on the side surface MRs of the sealing body MR. In the case of the QFP or the SOP, the outer lead portion OLD protrudes from the side surface MRs of the sealing body MR and has a shape curved toward the mounting surface side. Although not shown, there is also a semiconductor package of a so-called non-lead type in which each of the plurality of leads LDs is exposed on the lower surface MRb of the sealing body MR as a modified example for the semiconductor package PKG1.

The inside of the sealed body MR semiconductor chip CP is sealed. Semiconductor chip CP, the surface (upper surface, the main surface) CPt, the back surface CPb of the opposite side of the surface CPt (see FIG. 2), and in a cross-sectional view in the thickness direction of the semiconductor chip CP, between the surface CPt and the back surface CPb It has a side located. On the front surface CPt of the semiconductor chip CP, a plurality of bonding pads PD are provided in two rows along each of four sides constituting the outer edge of the front surface CPt. Further, the semiconductor chip CP (specifically, semiconductor substrate) is made of, for example, silicon (Si). Although not shown, the main surface of the semiconductor chip CP (in particular, the semiconductor element forming region provided on upper surface of semiconductor substrate of the semiconductor chip CP), a plurality of semiconductor elements (circuit elements) are formed. Then, a plurality of bonding pads PD, the interior of the semiconductor chip CP (specifically, between the surface CPt and the semiconductor element forming region (not shown)) through the wiring formed in the wiring layer to be disposed (not shown), the semiconductor element and electrically connected. That is, a plurality of bonding pads PD is electrically connected to a circuit formed in the semiconductor chip CP.

Further, the surface CPt of the semiconductor chip CP, the insulating film covering substrate and the wiring of the semiconductor chip CP is formed, each surface of the plurality of bonding pads PD, in the opening formed in the insulating film, is exposed from the insulating film. The bonding pad PD is made of metallic, and in the present embodiment, the bonding pad PD is made of aluminum (Al), for example.

The semiconductor chip CP is mounted on the die pad DP is a chip mounting portion. For the semiconductor package PKG1, the die pad (chip mounting portion) DP is disposed inside the sealing body MR, the semiconductor chip CP is mounted on upper surface (surface, main surface, chip mounting surface) DPt of the die pad DP.

Further, the semiconductor chip CP as shown in FIG. 2, while the back CPb faces upper surface DPt of the die pad DP, is mounted on the die pad DP through the die bonding material (adhesive) DB. That is, the opposite surface of the surface (main surface) CPt a plurality of bonding pads PD is formed (rear surface CPb) is opposed to the chip mounting surface (upper surface DPt), so-called, is mounted by a face-up mounting method. The die bonding material DB is an adhesive material for die bonding the semiconductor chip CP, and is, for example, an epoxy-based thermosetting resin, or a conductive resin adhesive material in which a plurality of conductive particles (e.g., silver particles) are contained in the epoxy-based thermosetting resin, or a solder material.

Around the semiconductor chip CP (in other words, around the die pad DP), a plurality of leads LD is disposed. A plurality of bonding pads exposed at the surface CPt of the semiconductor chip CPt (electrode) PD, an inner lead portion ILD of a plurality of leads LD located inside the sealing body MR, a plurality of wires (conductive member) It is electrically connected via a BW, respectively. One end of the wire BW is bonded to the bonding pad PD, the other end is bonded to a portion of the inner lead portion ILD (bonding region).

<Semiconductor Chip>

Figure 4:
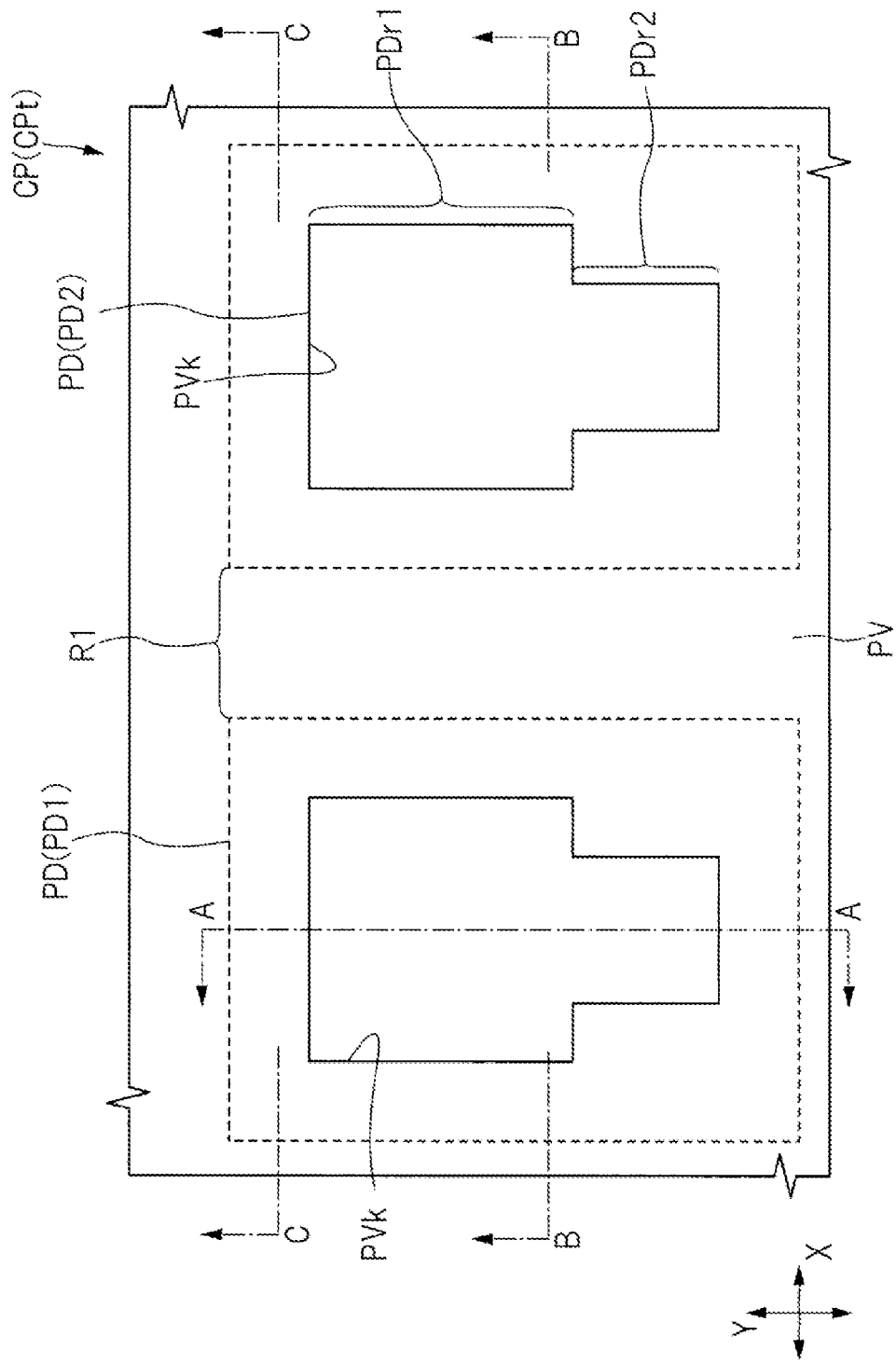
FIG. 4 is an enlarged plan view at A portion shown in FIG. 3.
Figure 5:
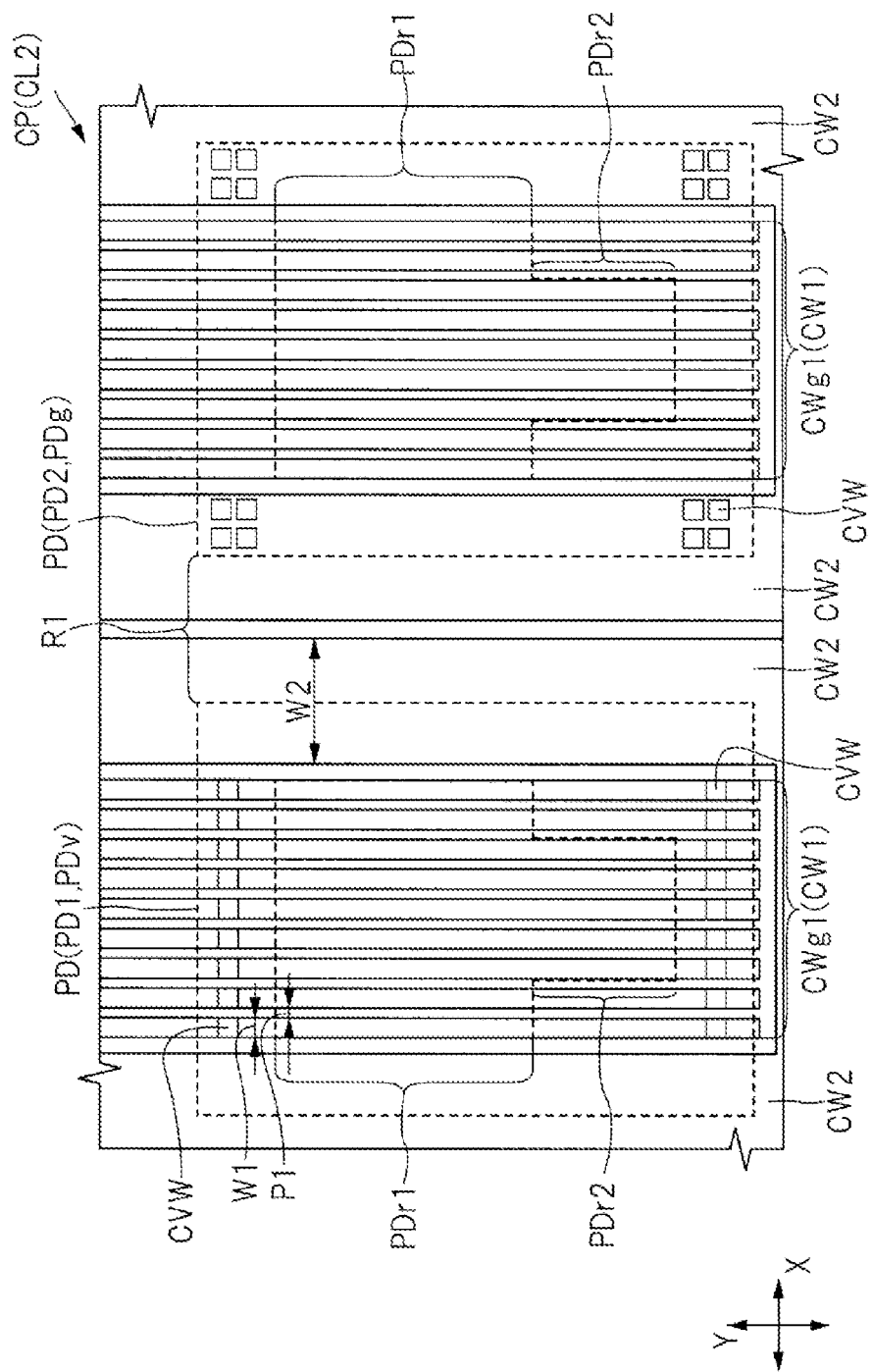
FIG. 5 is a transparent plan view showing the positional relationship between a bonding pad shown in FIG. 4 and a wiring formed in a wiring layer located below.
Figure 6:
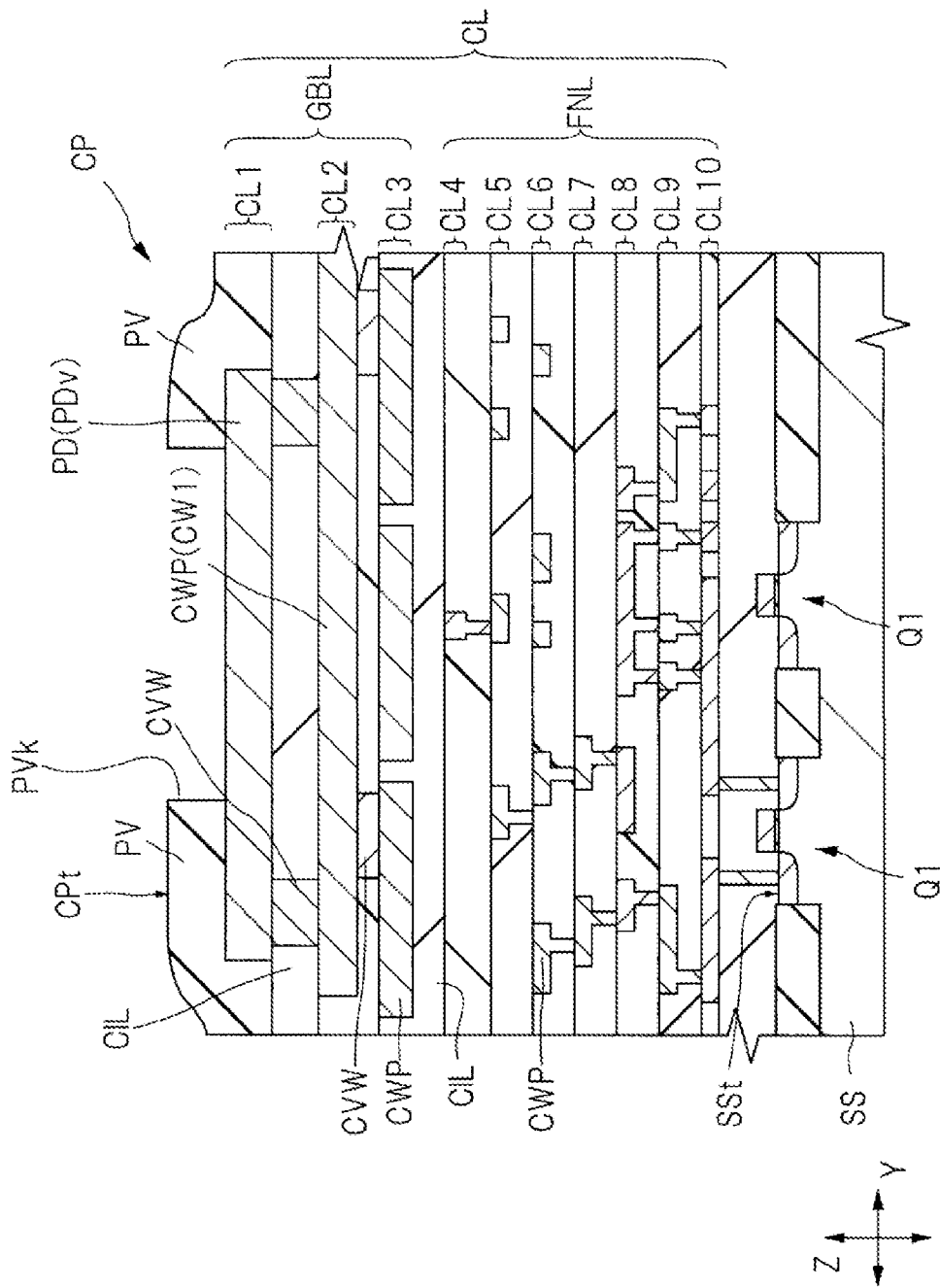
FIG. 6 is an enlarged cross-section view along A-A line of FIG. 4.
Figure 7:
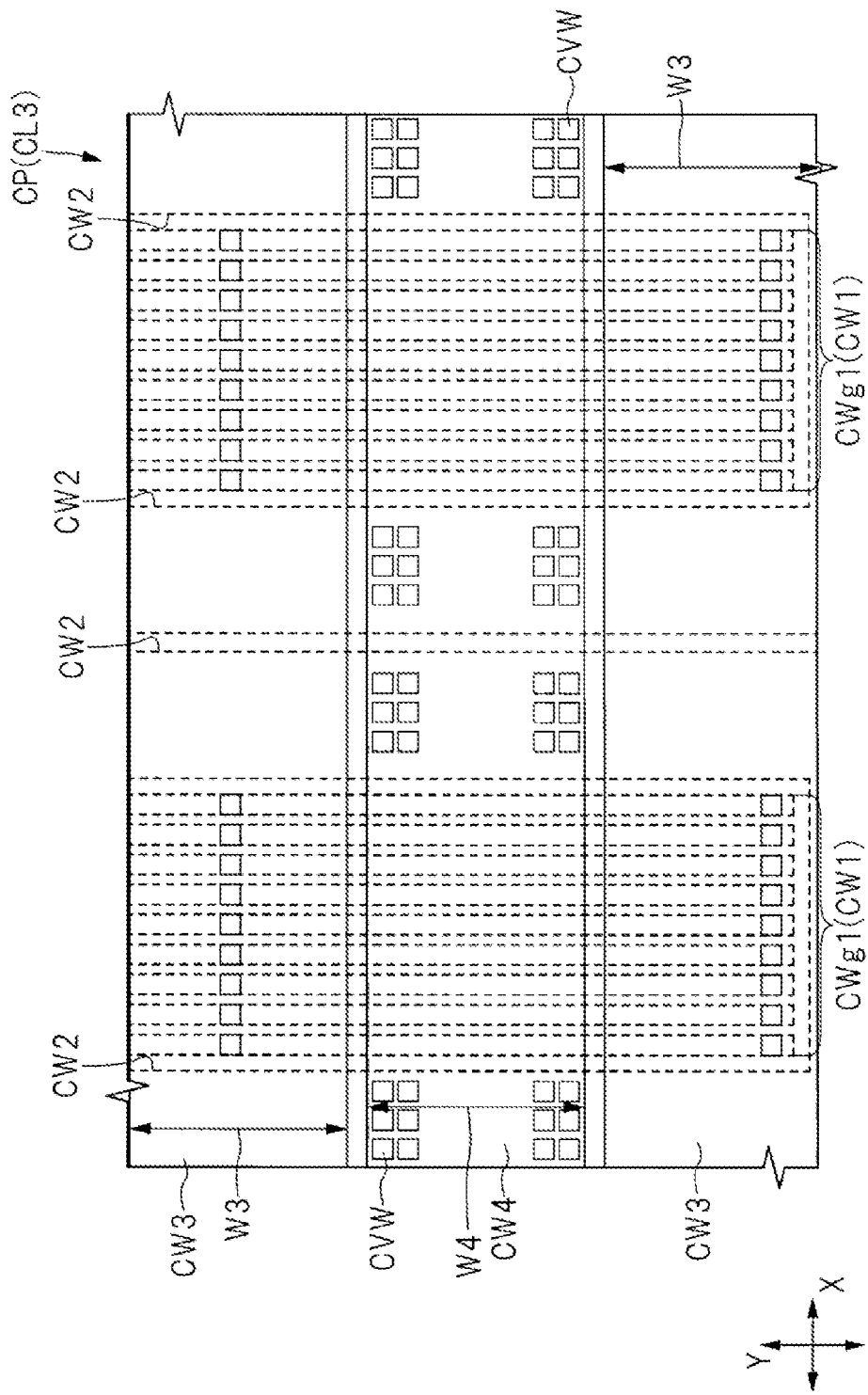
FIG. 7 is a transparent plan view showing the wiring layer located one layer below the wiring layer shown in FIG. 5.
Figure 8:
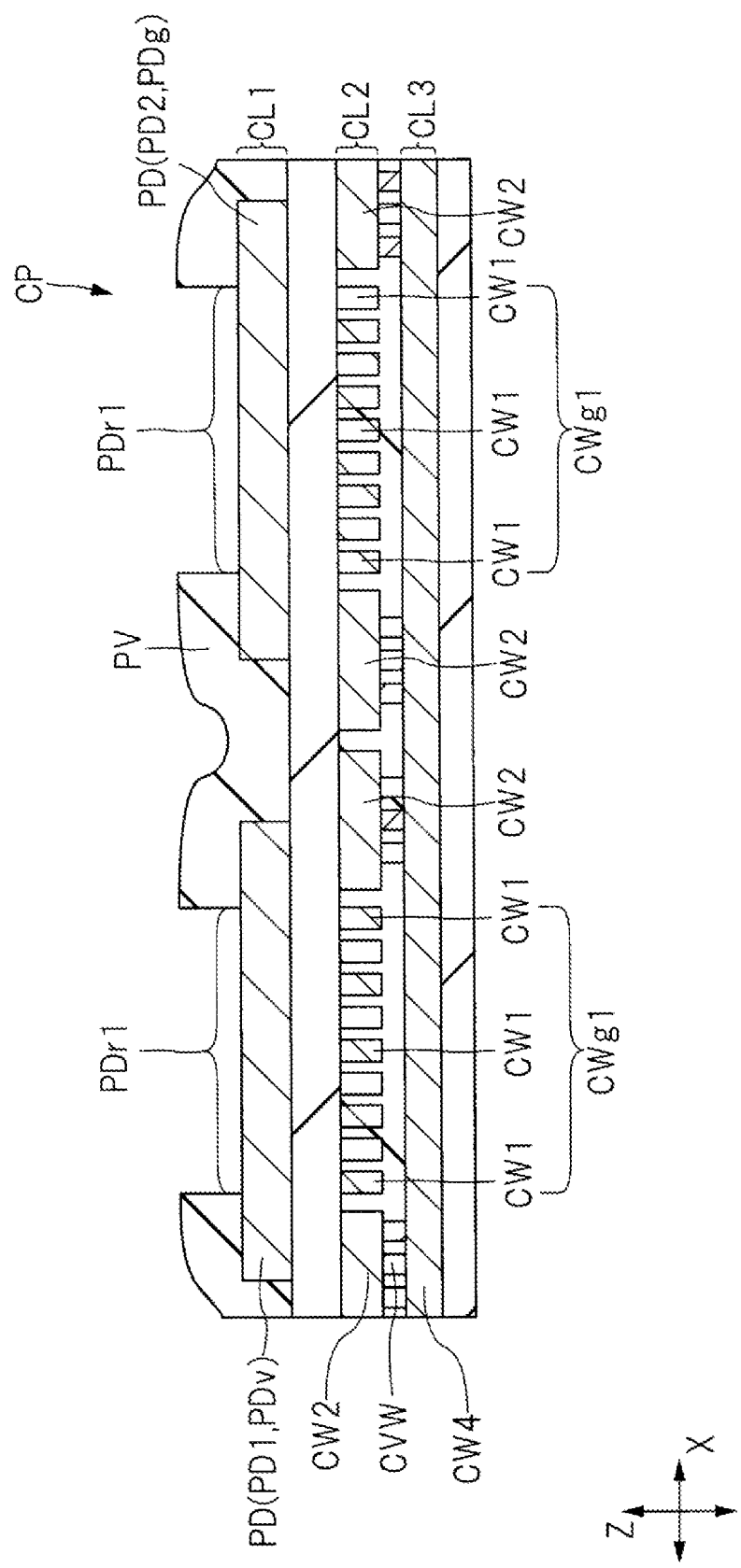
FIG. 8 is an enlarged cross-section view along B-B line of FIG. 4.
Figure 9:
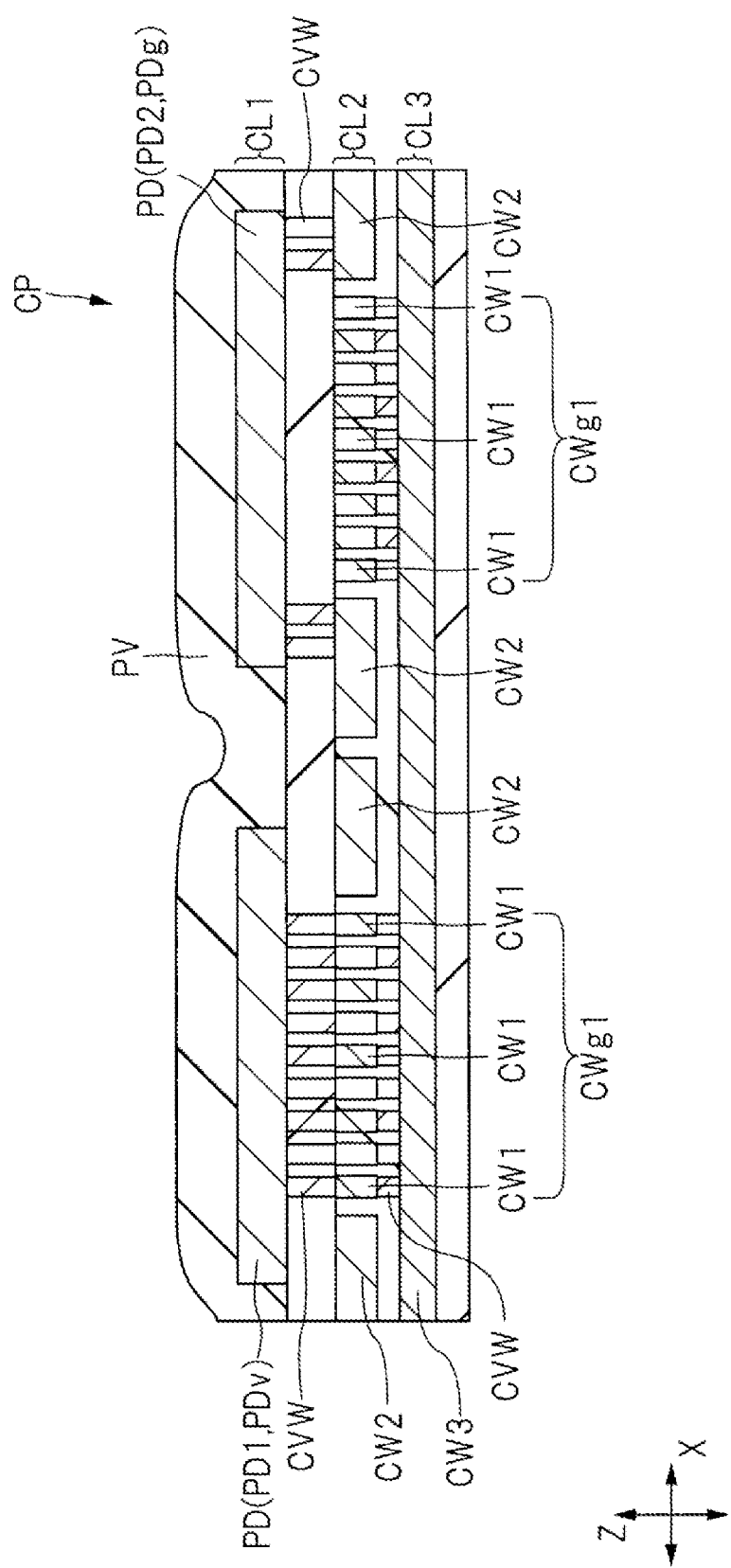
FIG. 9 is an enlarged cross-section view along C-C line of FIG. 4.

Next, the semiconductor chip CP shown in FIG. 2 will be described in detail. FIG. 3 is a plan view seen from a front surface of a semiconductor chip shown in FIG. 2. FIG. 4 is an enlarged plan view at A portion shown in FIG. 3. FIG. 5 is a transparent plan view showing the positional relationship between a bonding pad shown in FIG. 4 and a wiring formed in a wiring layer located below. FIG. 6 is an enlarged cross-section view along A-A line of FIG. 4. FIG. 7 is a transparent plan view showing the wiring layer located one layer below the wiring layer shown in FIG. 5. FIG. 8 is an enlarged cross-section view along B-B line of FIG. 4. FIG. 9 is an enlarged cross-section view along C-C line of FIG. 4. Although FIG. 5 is a plan view of the wiring layer CL2 shown in FIG. 6, in order to clarify the positional relationship in plan view between the wiring formed on the wiring layer CL2 and the bonding pad PD and the bonding region (bonding area) PDr1, these contours are shown by dotted lines. Although FIG. 7 is an plan view of the wiring layer CL3 shown in FIG. 6, in order to specify the positional relationship in plan view between the wiring formed in the wiring layer CL3 and the wiring formed in the wiring layer CL2, the outline of the wiring formed in the wiring layer CL2 is shown by a dotted line. FIGS. 8 and 9 show, among the plurality of wiring layers CL shown in FIG. 6, a layer of each of the wiring layers CL1~CL3, but not show a layer of each of the wiring layers CL4~CL10.

The semiconductor chip CP includes a semiconductor substrate SS (see FIG. 6), a plurality of wiring layers CL stacked on the main surface SSt of the semiconductor substrate SS (see FIG. 6), an insulating film (protective film) PV covering the wiring layer CL1 (see FIG. 6) that is provided at the uppermost layer, and a plurality of bonding pads PD formed in the wiring layer CL1.

The main surface SSt (see FIG. 6) of semiconductor substrate SS is comprised of a rectangular shape in plan view, and has a side CPs1 (see FIG. 3) extending in the X direction (see FIG. 3), a side CPs2 (see FIG. 3) extending in the Y direction and crossing (perpendicular) to the X direction, a side CPs3 (see FIG. 3) located on the opposite side of the side CPs1, and a side CPs4 (see FIG. 3) located on the opposite side of the side CPs2. The main surface SSt of the semiconductor substrate SS (see FIG. 6) is a semiconductor element forming surface in which a plurality of semiconductor elements Q1 (see FIG. 6) is formed. The semiconductor substrate SS is a base material of the semiconductor chip CP, for example, is comprised of silicon (Si) as a main component.

Further, as shown in FIG. 6, on the main surface SSt of semiconductor substrate SS, a plurality of wiring layers CL are stacked. A plurality of wiring layers CL, as shown in FIG. 6, a fine layer FNL, and a global layer GBL formed on the fine layer FNL, having. As shown in FIG. 6, the global layer GBL has wiring layers CL2, CL3. As shown in FIG. 6, the fine layer FNL has wiring layers CL4, CL5, CL6, CL7, CL8, CL9, CL10. Here, the thickness of each wiring formed in the wiring layer CL2, CL3 constituting the global layer GBL is larger than the thickness of each wiring formed in the wiring layer CL4, CL5, CL6, CL7, CL8, CL9, CL10 constituting the fine layer FNL. Further, the width of each wiring formed in the wiring layer CL2, CL3 constituting the global layer GBL (thickness) is larger than the width of each wiring formed in the wiring layer CL4, CL5, CL6, CL7, CL8, CL9, CL10 constituting the fine layer FNL (thickness). Of the plurality of wiring layers CL, the uppermost layer of the wiring layer CL1, a plurality of bonding pads PD are formed. Each of the plurality of bonding pads PD is a semiconductor device formed on the main surface SSt of semiconductor substrate SS via a conductor pattern CWP formed in the plurality of wiring layers CL (e.g., the semiconductor device Q1 in FIG. 6) and electrically connected.

Each of the plurality of wiring layers CL, a plurality of conductor patterns (wiring pattern) CWP is formed. Between the plurality of conductor patterns CWP, the insulating layer CIL is interposed. Conductor pattern CWP is embedded in the opening formed in the insulating layer CIL. A plurality of conductor patterns CWP adjacent to each other is insulated by an insulating layer CIL. That is, each insulating layer CIL formed in the plurality of wiring layers CL functions as an insulating material for insulating each other a plurality of conductor patterns CWP formed in each wiring layer. In the present embodiment, this insulating layer CIL is, for example, an inorganic film made of silicon oxide. Further, the conductor pattern CWP of each wiring layer CL is electrically connected to the conductor pattern CWP of the wiring layer CL adjacent to the wiring layer CL whose conductor pattern CWP is formed. A conductor pattern CWP formed in the wiring layer CL of the upper layer, and the conductor pattern CWP formed in the wiring layer CL of the lower layer are electrically connected via a via CVW.

Of the plurality of wiring layers CL, the wiring layer CL1 disposed on the uppermost layer is covered with an insulating film (protective film) PV. The insulating film PV has a surface (upper surface, main surface) CPt of the semiconductor chip CP. The insulating film PV, a plurality of openings PVk are formed. A portion of the plurality of bonding pads PD is exposed from the insulating film PV at the opening PVk. As shown in FIG. 4, for the present embodiment, the exposed surface where the bonding pad PD is exposed from the insulating film PV includes the bonding region PDr1 and the probe region (probe area) PDr2. Bonding region PDr1 is a region to be bonded conductive member such as wire BW (see FIG. 2). Conductive members, such as wire BWs, are joined somewhere in the bonding region PDr1. Also, when performing a continuity test of an integrated circuit formed on a semiconductor substrate SS (see FIG. 6), a test pin is connected to a portion of the probe region PDr2. Incidentally, the insulating film PV not only insulates each other a plurality of bonding pads PD formed in the wiring layer CL1 disposed on the uppermost layer, also functions as a protective film for protecting the semiconductor chip CP. Therefore, as shown in FIG. 6, a plurality of wiring layers CL (in particular, the wiring layer CL1) is covered with the insulating film PV. It consists of a different material from the insulating layer CIL described above. In the present embodiment, the insulating film PV is, for example, an inorganic film made of silicon oxide, an organic film made of polyimide, or a laminated film of an inorganic film made of silicon oxide and an organic film made of polyimide.

Conductor pattern CWP formed in each wiring layer CL from the wiring layer CL2 to the wiring layer CL10 shown in FIG. 6 is formed of, for example, a metallic mainly composed of copper. On the other hand, each of the plurality of bonding pads PD formed on in the wiring layer CL1 is formed of, for example, a metallic containing aluminum as a main component.

In the example shown in FIG. 6, of the bonding pad PD, a portion exposed from the insulating film PV at the opening PVk constitutes a part of the surface CPt of the semiconductor chip CP. However, as a modified example to FIG. 6, of the bonding pad PD, a portion exposed from the insulating film PV in the opening PVk, a metal film (not shown) (e.g., overpad metal or under bump metal, etc.) may be covered. In this case, the metal film stacked on the bonding pad PD is considered as a part of the bonding pad PD. The wire or bump electrode is electrically connected to the bonding pad PD through the metal film.

Each of the plurality of bonding pads PD shown in FIG. 4 is arranged along the side CPs1 shown in FIG. 3. As shown in FIG. 3, the plurality of bonding pads PD included in the present embodiment semiconductor chip CP are arranged in two rows along each of the sides CPs1, CPs2, CPs3 and CPs4 of the semiconductor chip CP. FIG. 4 shows the bonding pads PDs in the first row relatively close to the side CPs1. The layouts of the bonding pads PD in the second row position relatively far from the side CPs1 will be described later.

The bonding pads PD shown in FIG. 4 include a bonding pad PD1 and a bonding pad PD2. In the embodiment shown in FIG. 4, the bonding pad PD1 is a bonding pad PDv (see FIG. 5) to which a power supply potential is to be supplied. The bonding pad PD2 is a bonding pad PDg (see FIG. 5) to which a reference potential is to be supplied. The bonding pads PD1 and the bonding pads PD2 are arranged so as to be adjacent to each other in the X-direction, in other words, along the side CPs1 shown in FIG. 3.

Further, as shown in FIG. 5, a plurality of wirings CW1 and one or more wirings CW2, which are respectively extending in the Y direction crossing to the X direction, are formed in the wiring layer CL2. In the example shown in FIG. 5, a plurality of wirings CW2 extending in the Y direction is formed in the wiring layer CL2. Each of the plurality of wirings CW2 is extended along the wiring CW1. Each of the plurality of wirings CW1 is arranged so as to be adjacent to each other in the X-direction. A power supply potential is to be supplied to each of the plurality of wirings CW1. The power supply potential is a potential for driving the circuit formed in the semiconductor chip CP. On the other hand, a reference potential is to be supplied to each of the plurality of wirings CW2. The reference potential is a potential different from the power supply potential, and is, for example, a ground potential.

<Supply Path of Power Supply Potential and Reference Potential>

With the enhancement of the functionality of the semiconductor chip CP, the supply path of the reference potential, for example, as a path to reduce the noise components contained in the various wiring paths (i.e., the return path of the signal transmission path) or as an electromagnetic shielding to suppress the propagation of electromagnetic noise from the inside or outside of semiconductor device. From the viewpoint of improving the characteristic of the above-mentioned function, it is preferable to reduce the impedance of the supply path of the reference potential. In the present embodiment, a structure for reducing impedances of a supply path of a reference potential and realizing enhancement of functions of the supply path of the reference potential as exemplified above will be described.

The bonding pad PD as described above is electrically connected with the conductor pattern CWP formed in a plurality of wiring layers CL as illustrated in FIG. 6. Of the plurality of wiring layers CL, it is required to arrange the conductive pattern CWP formed in the wiring layer CL2 located one layer below the wiring layer CL1 that is the uppermost layer and in which the bonding pad PD is formed in consideration of the stresses caused by connecting the conductive member such as a wire BW (see FIG. 2) to the bonding pad PD. That is, the wiring layer CL2 is susceptible to stresses generated at the bonding pad PD, as the distance between the wiring layer CL2 and the bonding pad PD is short.

For example, immediately below the bonding region PDr1 shown in FIG. 5, illustrating a case where the wiring according to the normal wiring rule is formed. When joining the tip of the wire BW to the bonding region PDr1, pressing the ball portion formed on the tip of the wire BW to the bonding region PDr1, for example, bonding the ball portion and the bonding pad PD to apply thermal and ultrasonic waves. At this time, since an external force is applied to the bonding pad PD, of the bonding pad PD, the region immediately below the bonding region PDr1, relatively stronger stresses than the surroundings propagate. In the wiring layer CL2, as described above, if the wiring is formed directly below the bonding region PDr1, the wiring is easily damaged by the effect of stresses generated in the bonding region PDr1. The cause of such stress generation is not limited to wire bonding. For example, when a columnar protrusion electrode called a copper pillar is formed on the bonding pad PD, the protrusion electrode can be formed by a plating method. In this case, when forming the protruding electrode, a large external force is not applied to the bonding pad PD. However, when mounting the semiconductor chip protruding electrode is formed in such wiring substrate (not shown), a strong external force is applied to the bonding pad PD through the protruding electrode. Consequently, relatively stronger stresses than the surroundings propagate to the area just below the bonding region PDr1.

Therefore, it has been considered preferable that the wiring is not formed at a position overlapped with the bonding region PDr1 to which the conductive member such as a wire or a protruding electrode is to be connected.

However, according to the study of the present inventors, it has been found that, in the wiring layer CL2 shown in FIG. 6, it is possible to suppress damage to the wiring even at a position overlapped with the bonding region PDr1 of the bonding pad PD, when a plurality of wirings each having a narrow width is arranged next to each other.

As shown in FIG. 5 that is a transparent plan view seen from the upper surface side of the insulating film PV (see FIG. 6), in case of the semiconductor chip CP according to the present embodiment, each of the plurality of wirings CW1 is arranged so as to be adjacent to each other. Further, each of the plurality of wirings CW1 is arranged such that each of the plurality of wirings CW1 is extended in the Y direction, which is crossing to the X direction, at a position overlapped with the bonding region PDr1 of the bonding pad PD1. In other words, in the transparent plan view, the wiring group CWg1 consisting of a plurality of wirings CW1 arranged next to each other is arranged at the position (area) overlapping the bonding region PDr1 of the bonding pad PD1. Further, as shown in FIG. 5, the wiring CW2 is arranged, in the wiring layer CL2, such that the wiring CW2 is extended along one of the plurality of wirings CW1 at a position (area) overlapped with the area (region) R1 between the bonding pad PD1 and the bonding pad PD2.

The width W1 of each of the plurality of wirings CW1 is less than the width W2 of the wiring CW2, for example, 1.0 μm or less. The width W2 of the wiring CW2 is, for example, about 5 μm to 10 μm. Each of the plurality of wiring CW1 has a high property of relaxing the applied stresses compared to the wide wiring because the width is narrow. Further, when a plurality of wiring CW1 are arranged so as to be adjacent to each other, each of the plurality of wirings CW1 functions as a reinforcing member for reinforcing the strength of the wiring CW1 disposed next. Thus, each of the plurality of wirings CW1 of the present embodiment, in the wiring layer CL2, even if disposed at a position overlapping the bonding region PDr1, has a structure that is hardly damaged.

From the viewpoint of improving the function as a reinforcing member of the plurality of wiring CW1, it is particularly preferable that the distance (interval) P1 between the plurality of wirings CW1 is equal to or less than the width W1 of each of the plurality of wirings CW1. In the example shown in FIG. 5, the distance P1 between adjacent wires CW1 is, for example, 0.50 μm. The width W1 of each of the plurality of wirings CW1 is preferably 1.0 μm or less. Further, the distance P1 between the plurality of wirings CW1 is preferably 0.55 μm or less.

For the present embodiment, as shown in FIG. 5, placing a plurality of interconnection CW1 is a supply path of the power supply potential in a region overlapping the bonding region PDr1 of the bonding pad PD1. Therefore, the periphery of the bonding region PDr1 can be utilized as a supply path of the reference potential. In other words, according to the present embodiment, in the wiring layer CL2 adjoining the wiring layer CL1 bonding pads PD is formed (see FIG. 6), the area of the conductive pattern CWP reference potential is supplied (see FIG. 6) it is possible to increase. As a result, the impedance of the supply path of the reference potential can be reduced.

For example, as shown in FIG. 5, the interconnection CW2 to which the reference potential is supplied is arranged at a position overlapping at least the area (region) R1 between the bonding pads PD1 and PD2. In the embodiment shown in FIG. 5, two wirings CW2 are arranged at positions overlapping with the area R1. For the example shown in FIG. 5, a plurality of narrow wiring CW1 of the width, since each of the wide plurality of wiring CW2 are arranged in a narrow pitch, from the viewpoint of processing accuracy improvement, the wiring width of the relatively wide wiring CW2 It is provided with an upper limit. Two wiring CW2 disposed at a position overlapping the area R1, each other through the wiring CW4 formed in the wiring layer CL3 (see FIG. 8) (see FIG. 8), and are electrically connected. However, as modified example to FIG. 5, further wide wiring CW2 by integrating the two wiring CW2 disposed at a position overlapping the area R1 may be arranged.

Further, in the example shown in FIG. 5, in the X direction, both adjacent to the wiring group CWg1 consisting of a plurality of wiring CW1, the wiring CW2 each reference potential is supplied is disposed. In other words, the wiring layer CL2, a plurality of wiring CW2 extending along one of the plurality of wiring CW1 is formed, the wiring group CWg1 consisting of a plurality of wiring CW1 arranged so as to be adjacent to each other is sandwiched between the plurality of wiring CW2. In this case, a plurality of wiring CW1, it is possible to reduce the electromagnetic effect between the peripheral conductive pattern CWP (see FIG. 6).

Each of the plurality of wiring CW1 disposed at a position overlapping the bonding pad PD1 is electrically connected to the bonding pad PD1 via the via CVW. Further, a part of the plurality of wiring CW2 (two in FIG. 5) overlaps the bonding pad PD1, and does not overlap the bonding region PDr1 of the bonding pad PD1.

Further, in the example shown in FIG. 5, the wiring group CWg1 consisting of a plurality of wiring CW1 at a position overlapping with each of the plurality of bonding pads PD is disposed. At a position overlapping the respective bonding region PDr1 of the bonding pad PD1 and the bonding pad PD2, a plurality of wiring CW1 are arranged. Further, both adjacent to the bonding region PDr1 of the bonding pad PD1, and adjacent to the bonding region PDr1 of the bonding pad PD2, respectively, the wiring CW2 extending along one of the plurality of wiring CW1 is disposed. The bonding pad PD2 is electrically connected to the plurality of wiring CW2, and the reference potential is supplied.

As described above, at a position overlapping the bonding region PDr1 of the bonding pad PD2 the reference potential is supplied, when a plurality of wiring CW1 power supply potential is supplied is arranged, the bonding region PDr1 around the overlapping position, it is possible to arrange the wiring CW2 for wide reference potential. Each of the plurality of wiring CW2 disposed at a position overlapping the bonding pad PD2 is electrically connected to the bonding pad PD2 via a plurality of vias CVWs. As a modified example to FIG. 5, at a position overlapping the bonding region PDr1 of the bonding pad PD2 the reference potential is supplied, there is a case of arranging the wiring for a plurality of reference potentials at the same wiring width and arrangement spacing as the plurality of wiring CW1. In the embodiment shown in FIG. 5, the impedances of the reference potential supplying paths in the interconnection layers CL2 can be reduced as compared with the above-described modified example.

Further, each of the plurality of wiring CW1 disposed at a position overlapping the bonding region PDr1 of the bonding pad PD2 is separated from the bonding pad PD2. In addition, each of the plurality of wirings CW1 arranged at a position overlapping with the bonding region PDr1 of the bonding pad PD2 is electrically connected to each of the plurality of wirings CW1 arranged at a position overlapping with the bonding region PDr1 of the bonding pad PD1 via the wiring CW3 (see FIG. 9) formed in the wiring layer CL3 (see FIG. 9). As in the present embodiment, when supplying the power supply potential through a plurality of wiring CW1 wire width is narrow, there is a concern that the impedance of the supply path of the power supply potential is increased. Therefore, it is formed in the wiring layer CL2, and a plurality of wiring CW1 disposed at positions overlapping the respective bonding region PDr1 of the plurality of bonding pads PD (see FIG. 5) (see FIG. 5), as shown in FIG. 7, the bonding region PDr1 at a position not overlapping, by electrically connected to each other via a wiring CW3 formed in the wiring layer CL3, it is possible to suppress the impedance of the supply path of the power supply potential is increased.

As shown in FIG. 7, the wiring layer CL3 provided one layer below the wiring layer CL2 (see FIG. 5) includes a wiring CW3 electrically connected with the plurality of wirings CW1. Also, the power supply potential is to be supplied to the wiring CW3. Also, the wiring CW3 is extended along the side CPs1 so as to cross to each of the plurality of wirings CW1 and the wiring CW2 in transparent plan view (see FIG. 3). Further, the wiring layer CL3 includes a wiring CW4 electrically connected with the plurality of wirings CW2. Also, the reference potential is to be supplied to the wiring CW4. Also, the wiring CW4 is extended along the side CPs1 so as to cross to each of the plurality of wirings CW1 and the wiring CW2 in a transparent plan view (see FIG. 3).

By connecting the plurality of wiring CW2 with each other via the wiring CW4 formed in the wiring layer CL3 provided one layer below the wiring layer CL2 (see FIG. 5), the charge in a part of the plurality of wiring CW2 can be dispersed through the wiring CW4 when the charge is concentrated in the part of the plurality of wiring CW2. As a result, it is possible to enhance the function as an electromagnetic shielding of the supply path of the reference potential.

Further, by connecting the plurality of wiring group CWg1 to each other through the wiring CW3 formed in the wiring layer CL3 provided in one lower layer of the wiring layer CL2 (see FIG. 5), in a part of the plurality of wiring group CWg1, the wiring CW3 when there is a rapid power demand it is possible to supply charges through. As a result, it is possible to stabilize the power supply through the supply path of the power supply potential.

In the example shown in FIG. 7 shows two wiring CW3 and one wiring CW4. Wiring CW3 and the wiring CW4 are arranged alternately in the Y direction. Further, each of the bonding pad PD1 and PD2 shown in FIG. 4 overlaps with each of the wiring CW3 and CW4 shown in FIG. 7. A plurality of bonding pads PD semiconductor chip CP shown in FIG. 3 comprises a plurality of bonding pads PDv power supply potential is supplied (see FIG. 5) and a reference potential is supplied PDg (see FIG. 5). If each of the plurality of bonding pads PD arranged in the X direction overlaps with the wiring CW3 shown in FIG. 7, it is possible to electrically connect the plurality of bonding pads PDv for power supply potential to each other. Further, if each of the plurality of bonding pads PD arranged in the X direction overlaps with the wiring CW4 shown in FIG. 7, it is possible to electrically connect the plurality of bonding pads PDg for the reference potential to each other.

Further, the two wiring CW3 spaced from each other through the wiring CW4, each other through the wiring CW1 formed in the wiring layer CL2 constituting the global layer GBL, and are electrically connected. Therefore, the supply of the power supply potential can be further stabilized.

Further, each of the width W4 of the width W3 and the wiring CW4 of the wiring CW3 is wider than the width W1 of the plurality of wiring CW1 (see FIG. 5). If the width W3 of the interconnection CW3 is wide, it is possible to reduce the impedance of the supply path of the power supply potential. Further, if the width W4 of the interconnection CW4 is wide, it is possible to reduce the impedance of the supply path of the reference potential.

Figure 10:
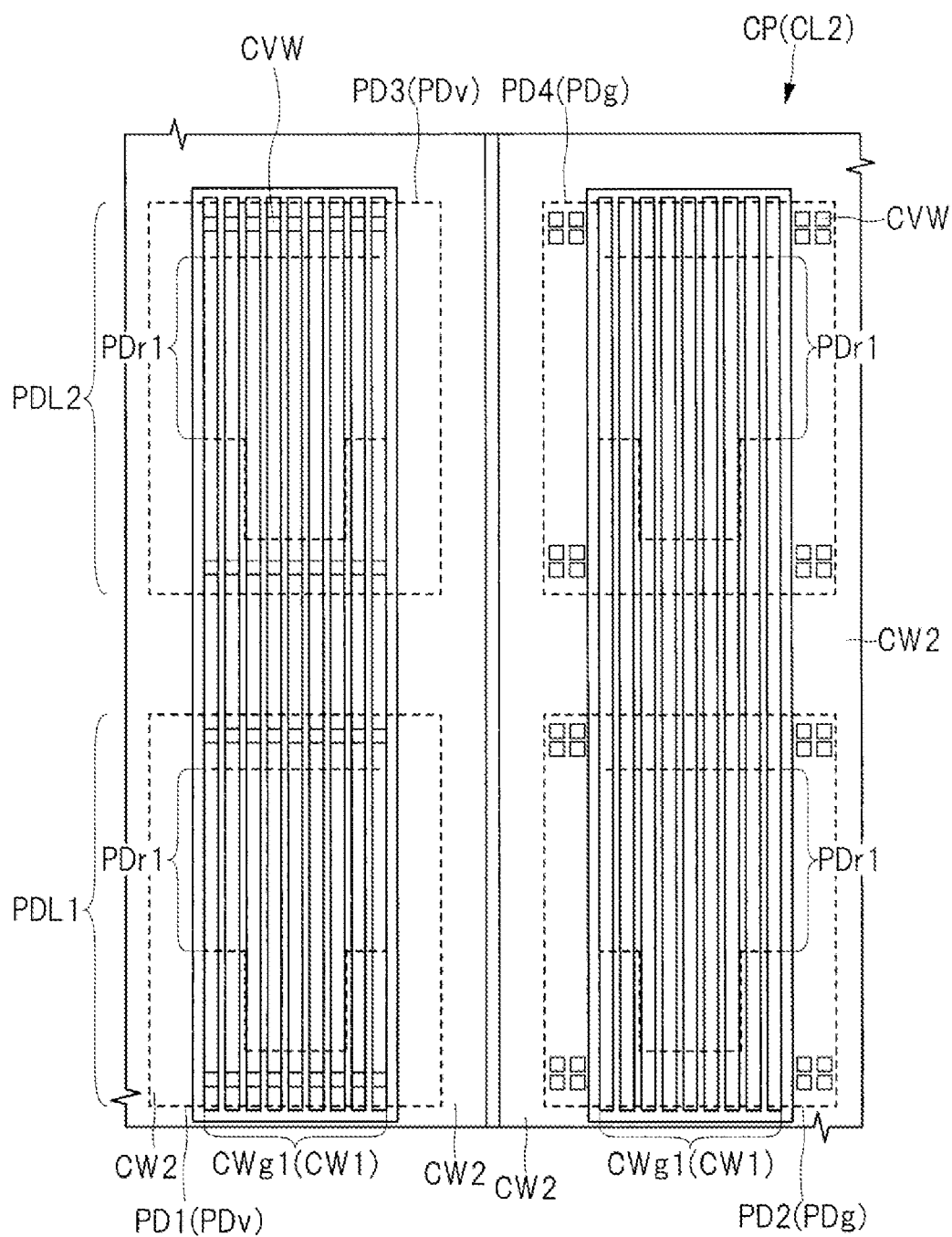
FIG. 10 is a transparent enlarged plan view showing an example of a wiring layout in the wiring layer corresponding to FIG. 5, in an enlarged plan view at B portion shown in FIG. 3.
Figure 11:
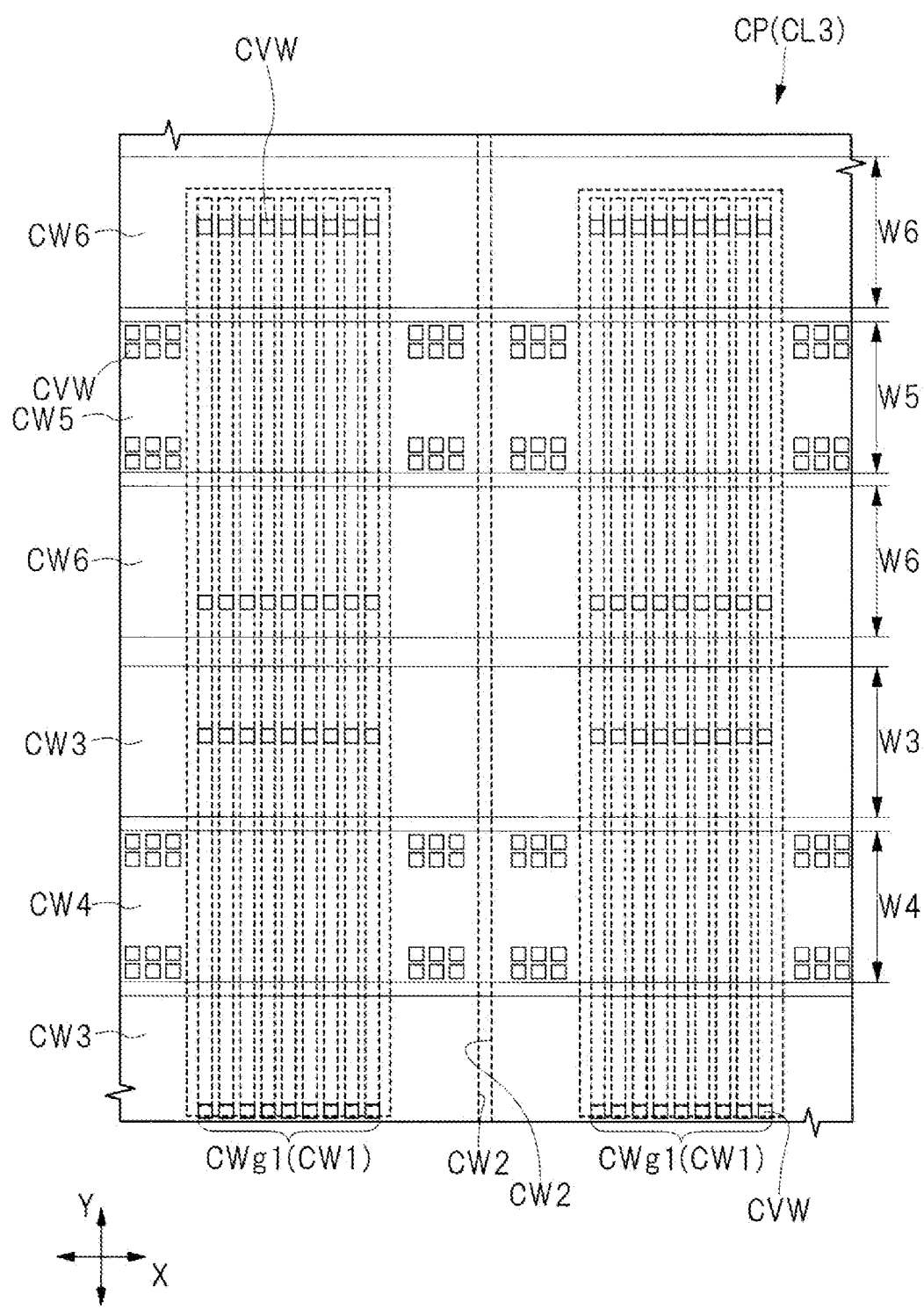
FIG. 11 is a transparent plan view showing the wiring layer located one layer below the wiring layer shown in FIG. 10.

Further, as shown in FIG. 3, a plurality of bonding pads PD semiconductor chip CP is provided includes a bonding pad PD1 (see FIG. 4) and the bonding pad PD2 (see FIG. 4), along the side CPs1 comprising a plurality of first row pads PDL1 arranged. The plurality of bonding pads PD includes a plurality of second row pads PDL2 disposed at a position farther from the side CPs1 than the plurality of first row pads PDL1. FIG. 10 is a transparent enlarged plan view showing an example of a wiring layout in the wiring layer corresponding to FIG. 5, in an enlarged plan view at B portion shown in FIG. 3. FIG. 11 is a transparent plan view showing the wiring layer located one layer below the wiring layer shown in FIG. 10.

Of the plurality of wirings CW1 shown in FIG. 10, each of the plurality of wirings CW1 disposed at a position overlapping the bonding region PDr1 of the bonding pad PD1 is electrically connected to one of the bonding pad PD1 and the plurality of second column bonding pad PDL2. Further, each of the plurality of wirings CW2 shown in FIG. 10 is electrically connected to one of the bonding pad PD2 and the plurality of second row bonding pad PDL2.

In the example shown in FIG. 10, a plurality of second row bonding pads includes a bonding pad PD3 disposed adjacent to the bonding pad PD1 in the Y direction, and a bonding pad PD4 disposed adjacent to the bonding pad PD2 in the Y direction. The bonding pad PD1 and the bonding pad PD3 are electrically connected via a plurality of wiring CW1. Further, the bonding pad PD2 and the bonding pad PD4 are electrically connected via a wiring CW2. In other words, the plurality of second row bonding pad PDL2 includes a bonding pad PD3 which is electrically connected to the bonding pad PD1 via a plurality of wiring CW1. In transparent plan view, each of the plurality of wiring CW1, at a position overlapping each of the bonding region PDr1 and the bonding region PDr1 of the bonding pad PD3 of the bonding pad PD1, are arranged so as to extend in the Y-direction.

Thus, one of the plurality of first row pads PDL1, by electrically connecting any of the plurality of second row pads PDL2, it is possible to increase the number of supply paths of the power supply potential or the reference potential. Thus, the power supply potential or the reference potential can be stably supplied.

Further, as shown in FIG. 10, the wiring layer CL2, a plurality of wiring CW2 extending along any of the plurality of wiring CW1 is formed. Wiring group CWg1 consisting of a plurality of wiring CW1 disposed adjacent to each other is sandwiched between the plurality of wiring CW2. The wiring layer CL3 shown in FIG. 11, the reference potential is supplied, and extends along the side CPs1 so as to intersect each of the wiring CW1 and the wiring CW2 in a transparent plan view (see FIG. 3), and is electrically connected to the plurality of wiring CW2, and a plurality of first row bonding pad PD1 overlapping the wiring CW4 is arranged. Further, the wiring layer CL3, the reference potential is supplied, and extends along the side CPs1 so as to intersect each of the wiring CW1 and the wiring CW2 in a transparent plan view, and a plurality of wiring CW2 and electrically connected, and a plurality of second row bonding pads and overlapping the wiring CW5 is arranged. In other words, each of the plurality of wiring CW2 extending in the Y direction in the wiring layer CL2 is electrically connected through the wiring CW4 and the wiring CW5 extending in the X direction in the wiring layer CL3. That is, a plurality of wiring CW4, CW5 separated from each other in the wiring layer CL3, each other through the wiring CW2 formed in the wiring layer CL2 constituting the global layer GBL, and are electrically connected. In this case, in transparent plan view, since the supply circuit of the reference potential is formed in a grid shape, when locally charges are concentrated in a portion of the supply path of the reference potential, easily dispersed around. Further, through the wiring formed in the wiring layer constituting the global layer GBL having a larger thickness and width than the wiring formed in the wiring layer constituting the fine layer FNL, a plurality of wiring CW4, CW5 to each other, and to electrically connect, it is possible to more stabilize the supply of the reference potential.

Further, the wiring layer CL3 shown in FIG. 11, the power supply potential is supplied, and extends along the side CPs1 so as to intersect each of the wiring CW1 and the wiring CW2 in a transparent plan view (see FIG. 3), and is electrically connected to a plurality of wiring CW1, and a plurality of first row bonding pad PD1 overlapping the wiring CW3 is disposed. Further, the wiring layer CL3, the power supply potential is supplied, and extends along the side CPs1 so as to intersect each of the wiring CW1 and the wiring CW2 in a transparent plan view, and a plurality of wiring CW1 and electrically connected, and a plurality of second row bonding pads and overlapping the wiring CW6 are arranged. In other words, each of the plurality of wiring CW1 extending in the Y direction in the wiring layer CL2 is electrically connected through the wiring CW3 and the wiring CW6 extending in the X direction in the wiring layer CL3. That is, a plurality of wiring CW3, CW6 separated from each other in the wiring layer CL3, each other through the wiring CW1 formed in the wiring layer CL2 constituting the global layer GBL, and are electrically connected. In this case, in transparent plan view, since the supply circuit of the power supply potential is formed in a grid shape, in a part of the supply path of the power supply potential, via the wiring CW3 and the wiring CW6 when there is a rapid power demand it is possible to supply charges. Further, through the wiring formed in the wiring layer constituting the global layer GBL having a larger thickness and width than the wiring formed in the wiring layer constituting the fine layer FNL, a plurality of wiring CW3, CW6 to each other, and to electrically connect, it is possible to more stabilize the supply of the power supply potential.

Further, as shown in FIG. 11, each of the width W5 of the width W4 and the wiring CW5 of the wiring CW4 is wider than the respective widths W1 of the plurality of wiring CW1 shown in FIG. Therefore, it is possible to reduce the impedance of the supply path of the reference potential in the wiring layer CL3. Further, each of the width W6 of the width W3 and the wiring CW6 of the wiring CW3 is wider than the respective widths W1 of the plurality of wiring CW1 shown in FIG. Therefore, it is possible to reduce the impedance of the power supply potential supply path in the wiring layer CL3.

<Method of Manufacturing Semiconductor Device>

Figure 12:
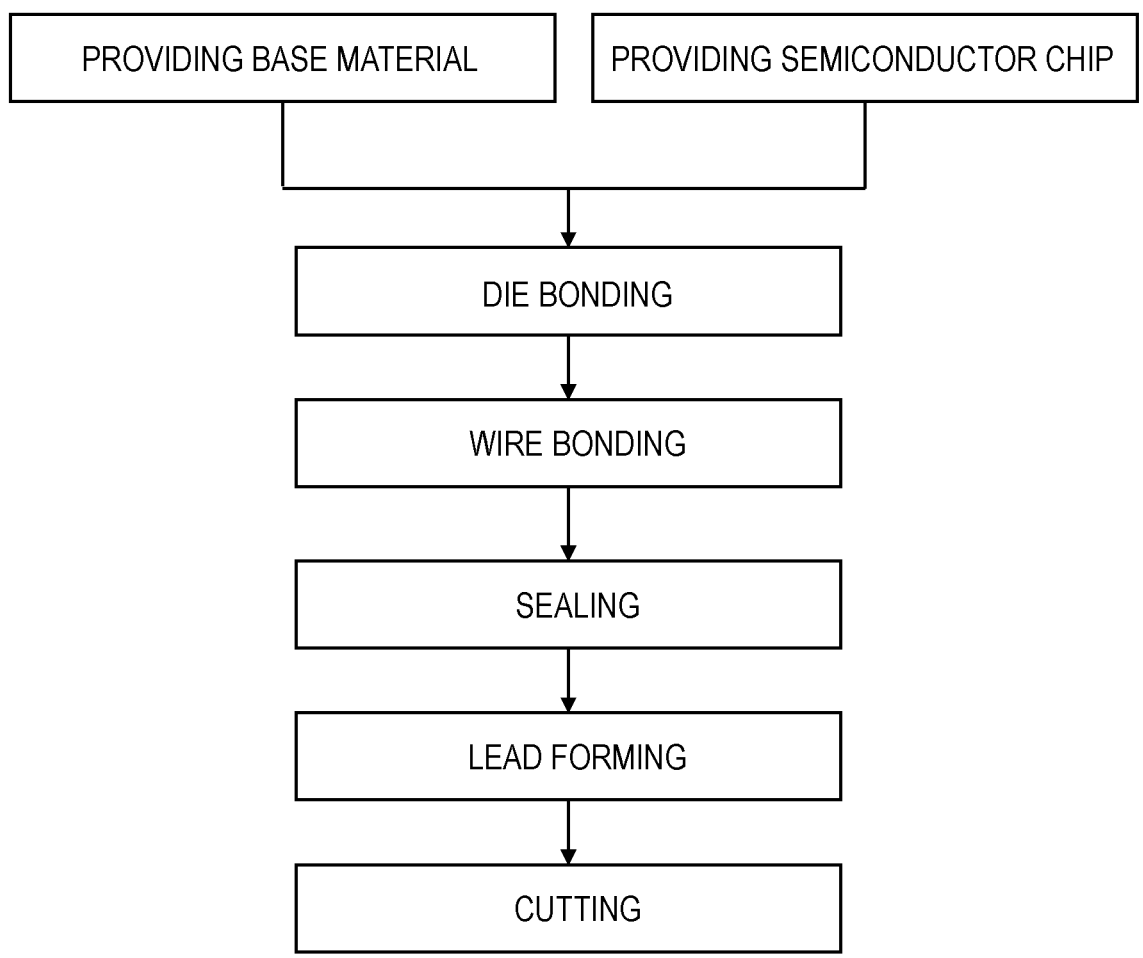
FIG. 12 is an explanation diagram showing an assembly flow of the semiconductor package according to one embodiment.

Next, manufacturing method of PKG1 shown in FIG. 1 will be described. The present embodiment semiconductor package PKG1 is manufactured according to the assembly flow shown in FIG. 12. FIG. 12 is an explanation diagram showing an assembly flow of the semiconductor package according to the present embodiment.

In the substrate preparation step shown in FIG. 12, a lead frame (substrate) (not shown) is prepared. The lead frame to be prepared in this process includes a die pad DP shown in FIG. 2, a plurality of leads LD disposed around the die pad DP. Prior to performing lead forming process shown in FIG. 12, the leads LDs are connected to each other. Further, prior to bending the lead LD in lead forming process shown in FIG. 12, each of the plurality of leads LD extends linearly in the X direction in the cross section shown in FIG. 2, for example. A plurality of leads LD is provided around the die pad DP is formed so as to extend toward the four sides.

<Preparation of Semiconductor Chip>

Further, in the semiconductor chip preparation step shown in FIG. 12, to prepare a semiconductor chip CP described with reference to FIGS. 3-11. In this step, for example, the main surface SSt of the semiconductor wafer made of silicon (not shown) (see FIG. 6), a plurality of semiconductor elements Q1 (see FIG. 6) and a wiring layer CL which is electrically connected thereto (see FIG. 6) to prepare a semiconductor wafer made of. Further, the uppermost layer of the wiring layer CL shown in FIG. 6, a plurality of bonding pads PD (see FIG. 3) is formed.

Further, so as to cover the wiring layer CL of the uppermost layer in which a plurality of bonding pads PD is formed, to form an insulating film PV (see FIG. 6). Thereafter, a plurality of openings PVk (see FIG. 3) are formed in the insulating film PV so that at least a portion of each of the plurality of bonding pads PD is exposed. After forming the semiconductor wafer as described above, cutting the semiconductor wafer along the dicing line of the semiconductor wafer, obtaining a plurality of semiconductor chips CP shown in FIG.

Incidentally, before cutting the semiconductor wafer, there is a case where the wafer test is performed. Wafer testing includes, for example, electrical testing to verify the conduction or characteristics of circuits formed in a semiconductor wafer. When performing an electrical test on a semiconductor wafer, a pin for testing (probe pin) is connected to a portion of the probe region PDr2 shown in FIG. 4.

<Die Bonding>

Next, in the die bonding step shown in FIG. 12 (semiconductor chip mounting step), as shown in FIG. 2, mounting the semiconductor chip CP to the die pad DP. Semiconductor chip CP has a back surface CPb located on the opposite side of the surface CPt and the surface CPt a plurality of bonding pads PD are formed. In this step, the back surface CPb of the semiconductor chip CP and the die pad DP are bonded and fixed via the die bond material DB. Semiconductor chip CP, so that the back surface CPb faces upper surface DPt is a chip mounting surface of the die pad DP, so-called, is mounted on the die pad DP by a face-up mounting method. The die bonding material DB is a bonding member for bonding and fixing the semiconductor chip CP and the die pad DP. As the die bonding material DB, a resin adhesive material, a solder material, or the like can be exemplified.

<Wire Bonding>

Figure 13:
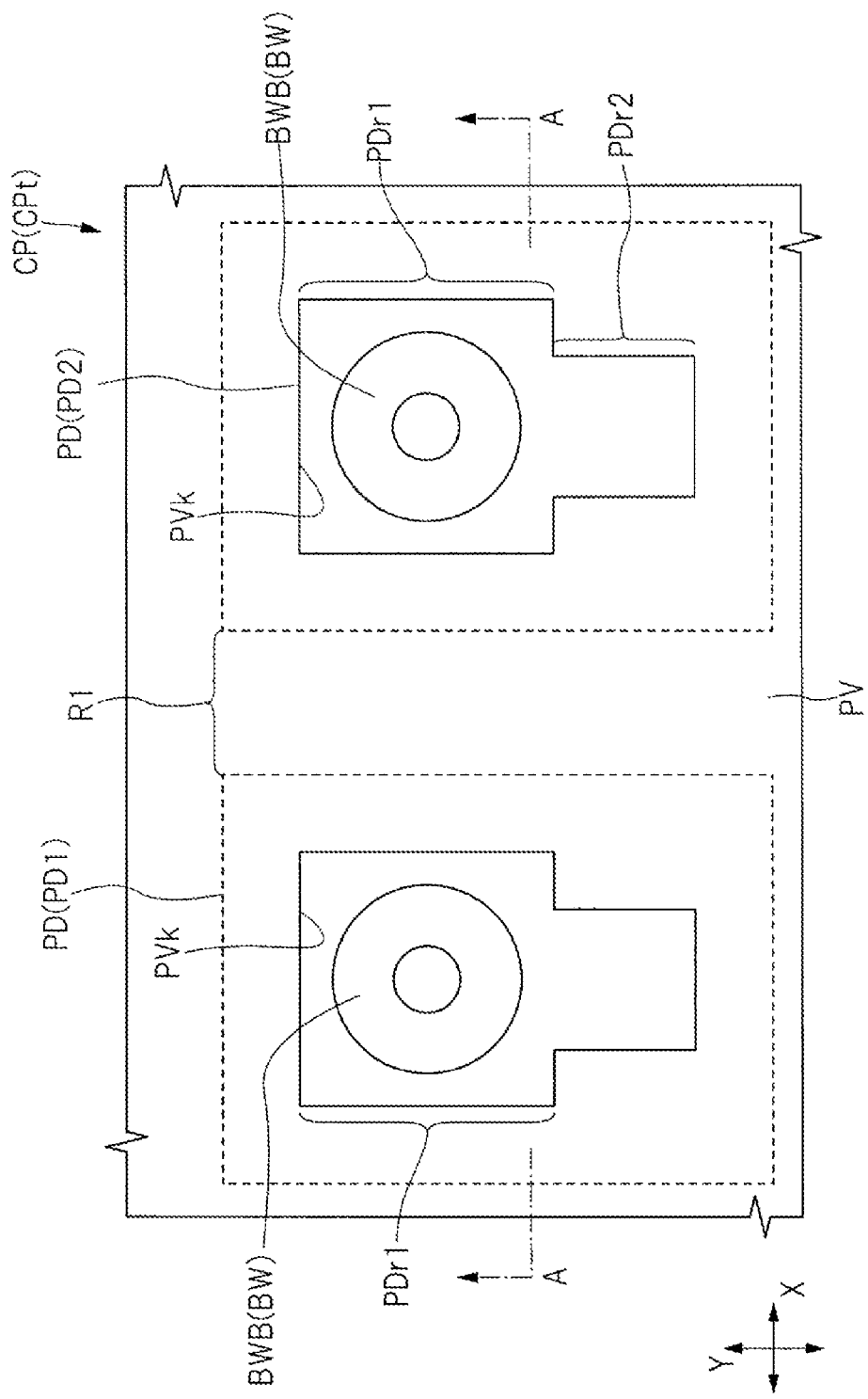
FIG. 13 is an enlarged plan view showing a condition after a wire is connected to a bonding region shown in FIG. 4.
Figure 14:
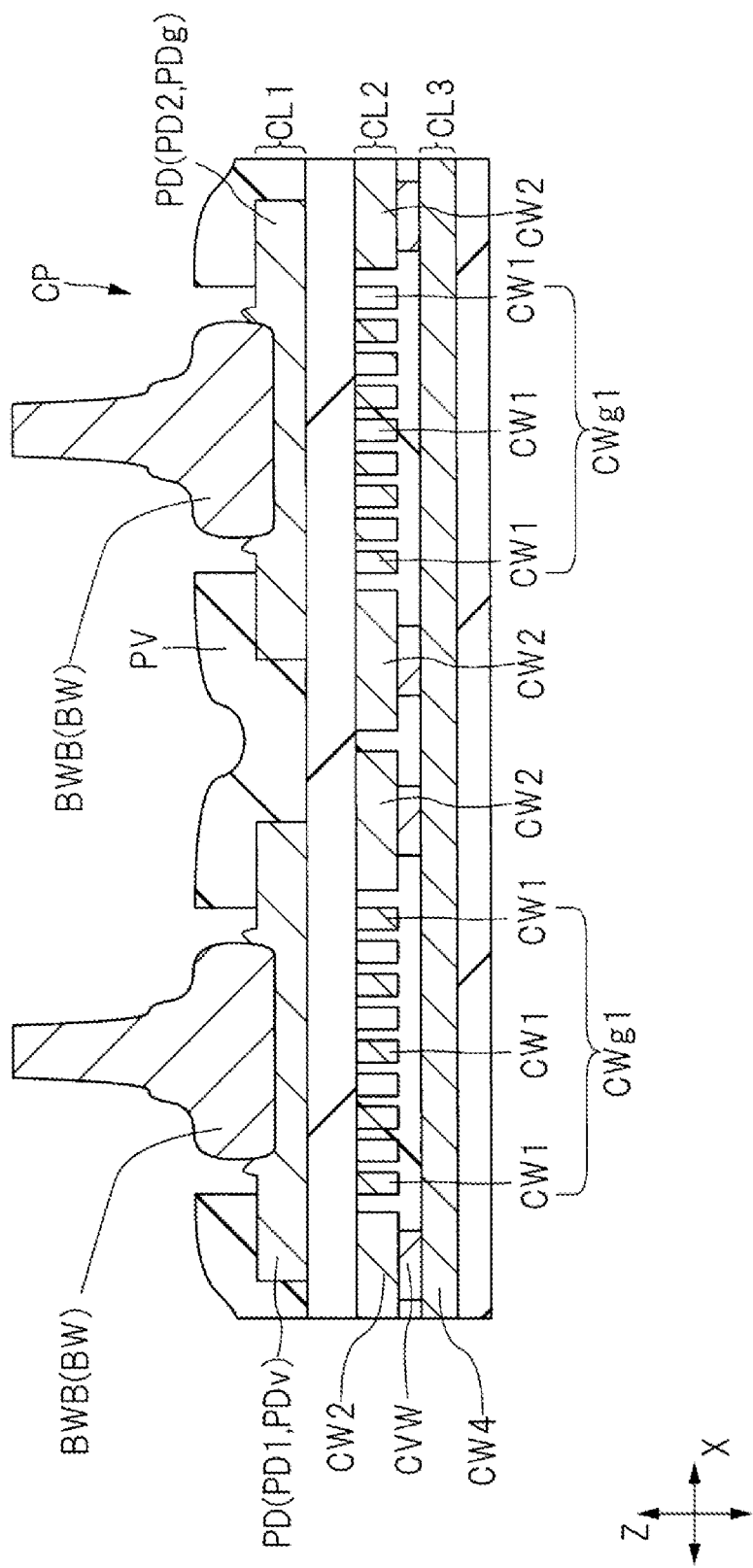
FIG. 14 is an enlarged cross-section view along A-A line of FIG. 13.

Next, in the wire bonding process shown in FIG. 12, as shown in FIG. 2, a plurality of bonding pads PD formed on the surface CPt of the semiconductor chip CP, a plurality of leads LD disposed around the semiconductor chip CP, a plurality of wires (conductive member) through the BW, respectively electrically connected. FIG. 13 is an enlarged plan view showing a condition after a wire is connected to a bonding region shown in FIG. 4. FIG. 14 is an enlarged cross-section view along A-A line of FIG. 13.

In this step, for example, one end portion of the wire BW made of a metal material such as copper (Cu) or gold (Au) (ball portion BWB shown in FIG. 14) is bonded to the pad PD of the semiconductor chip CP, the other end portion (stitched portion (not shown)) is bonded to the inner lead portion ILD of the lead LD shown in FIG. 2. Thus, the pad PD and the lead LD of the semiconductor chip CP is electrically connected via a wire BW.

The bonding region PDr1 shown in FIG. 13 is a region to be joined the ball portion of the wire BW (conductive member) BWB. Therefore, the ball portion BWB is bonded to a part of the bonding region PDr1. In other words, the bonding region PDr1 includes a region which does not overlap with the ball portion BWB after the wire bonding process. Further, as described above, the probe region PDr2 is an area for connecting test pins during wafer testing, and the ball portion BWB is not bonded to this area.

When joining the ball portion BWB and the bonding pad PD, after performing scrubbing operation (mechanical vibration for removing the oxide film of the bonding interface) by pressing the ball portion BWB to the bonding pad, applying ultrasonic waves to the ball portion BWB. Thus, the metal alloy constituting the metal and the bonding pad PD constituting the ball portion BWB to the bonding interface is formed, it is possible to improve the bonding strength.

In the wire bonding step, an external force is applied to the bonding pad PD via the ball portion BWB as described above. Therefore, the external force applied to the bonding pad PD is easily propagated in the thickness direction of the semiconductor chip CP. For the present embodiment, as described above, the wiring layer CL2, the wiring width (width W1 shown in FIG. 5) is arranged so that a plurality of narrow wiring CW1 are adjacent to each other. Therefore, even when the external force from the bonding pad PD is propagated, it is possible to suppress a plurality of wiring CW1 formed in the wiring layer CL is damaged.

<Sealing>

Next, in the sealing process shown in FIG. 12, each of the inner lead portions ILD of the semiconductor chip CP, the plurality of wires BW, and the plurality of leads LD shown in FIG. 2 is sealed with a resin to form a sealing body MR.

In this step, in a state in which a lead frame is disposed in a molding die (not shown) including a cavity (not shown), a resin is supplied into a space formed by the cavity, and then the resin is cured to form a sealing body (resin body) MR Such a method of forming the sealing body MR is called a transfer molding method.

<Lead Forming>

Next, in lead forming process shown in FIG. 12, as shown in FIG. 2, a plurality of leads LD is formed. In this step, the outer lead portion OLD is cut, and each of the plurality of leads LD is separated from the lead frame. Thus, each of the plurality of lead LD is separated from each other. Further, in this step, after cutting the leads LD, a plurality of leads LD is formed, and a bending process as shown in FIG. 2 is performed.

<Cutting>

Next, in the singulation step shown in FIG. 12, by cutting a plurality of suspension leads (not shown) for supporting the die pad DP shown in FIG. 2, respectively, to separate the semiconductor package.

After this process, required inspections and tests, such as visual inspections and electric tests, are performed, and the semiconductor package PKG1 of the completed semiconductor package shown in FIGS. 1 and 2 is obtained. The semiconductor package PKG1 is shipped or mounted on a mounting substrate (not shown).

Modified Example 1

Figure 15:
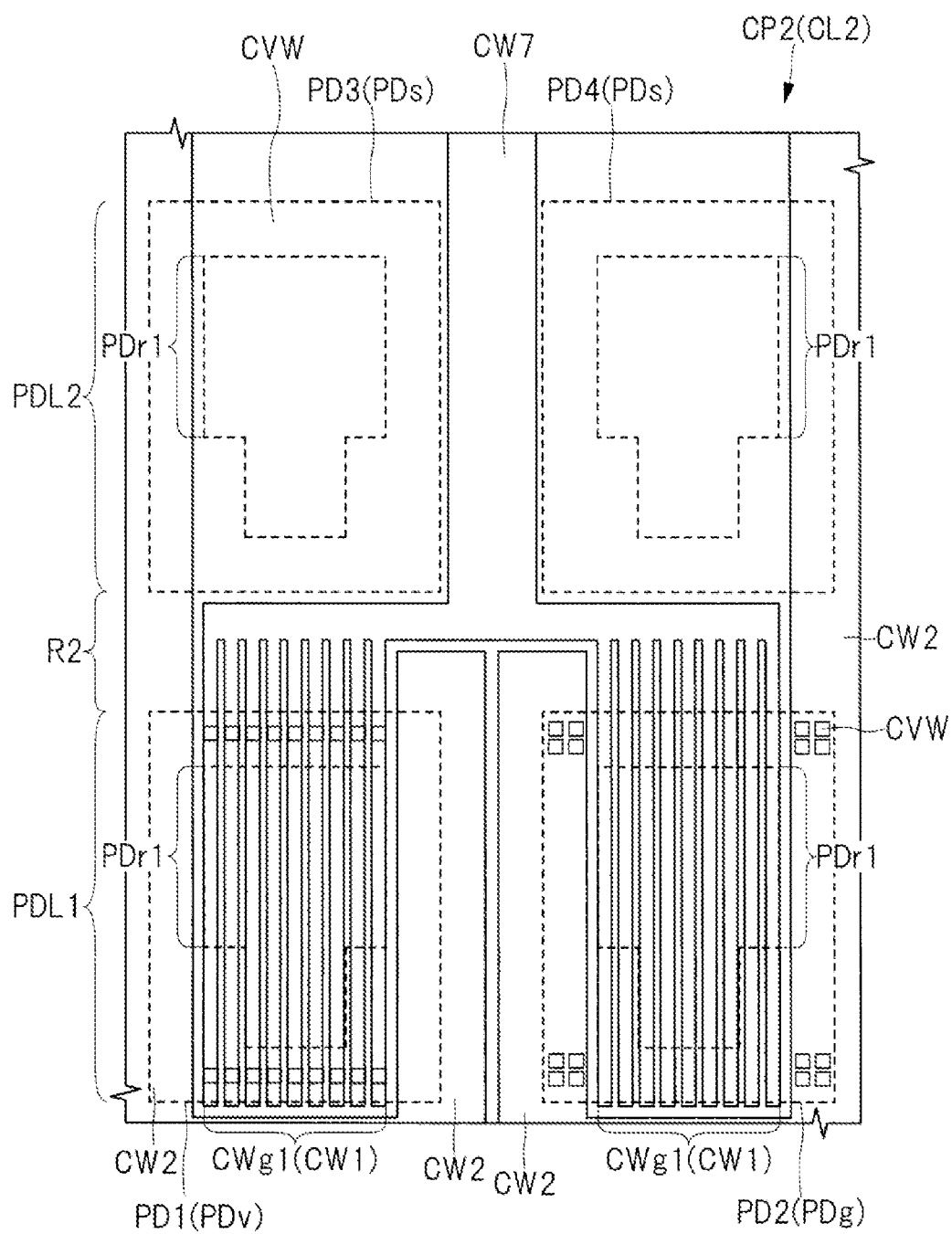
FIG. 15 is an enlarged plan view showing a modified example of FIG. 10.

While some modified examples have been described above, a typical modified example other than modified examples described above is described below. FIG. 15 is an enlarged plan view showing a modified example of FIG. 10. A semiconductor chip CP2 shown in FIG. 15, in a transparent plan view, each of the plurality of wiring CW1, overlap the bonding region PDr1 of the bonding pad PD1, and, the bonding region PDr1 of the plurality of second row bonding pads PDL2 in that it is disposed at a position that does not overlap each, different from the semiconductor chip CP shown in FIG. 10.

For the semiconductor chip CP2, the bonding pad PD3 disposed adjacent to the bonding pad PD1 in the Y direction, and each of the bonding pad PD4 disposed adjacent to the bonding pad PD2 in the Y direction is a bonding pad PDs as a signal terminal for inputting or outputting an electric signal. In this case, it is impossible to electrically connect the bonding pad PD1 and the bonding pad PD3. Further, it is impossible to electrically connect the bonding pad PD2 and the bonding pad PD4.

For the semiconductor chip CP2, a plurality of wirings CW1 overlapping the bonding region PDr1 of the bonding pad PD1, and a plurality of wirings CW1 overlapping the bonding region PDr1 of the bonding pad PD2 are connected to each other in an area (region) R2 between the first row pad PDL1 and the second row pad PDL2.

Further, among the plurality of second row bonding pads PDL2, between the bonding pad PD3 and the bonding pad PD4, the wiring CW7 is disposed. The wiring CW7 extends in the Y direction along the long side of the bonding pad PD3 is connected to each of the plurality of wirings CW1.

Although not shown, as in the example shown in FIG. 11, the wirings CW3, CW4, CW5 and CW6 each extending in the Y direction are provided in the wiring layer CL3 (see FIG. 6) located one layer below the wiring layer CL2 of the semiconductor chip CP2. The wiring CW7 shown in FIG. 10 is electrically connected with the wiring CW6 shown in FIG. 11 through a via (not shown).

The semiconductor chip CP2 shown in FIG. 15 is the same as the semiconductor chip CP shown in FIG. 10 except for the differences described above. Therefore, duplicate descriptions are omitted.

Modified Example 2

Figure 16:
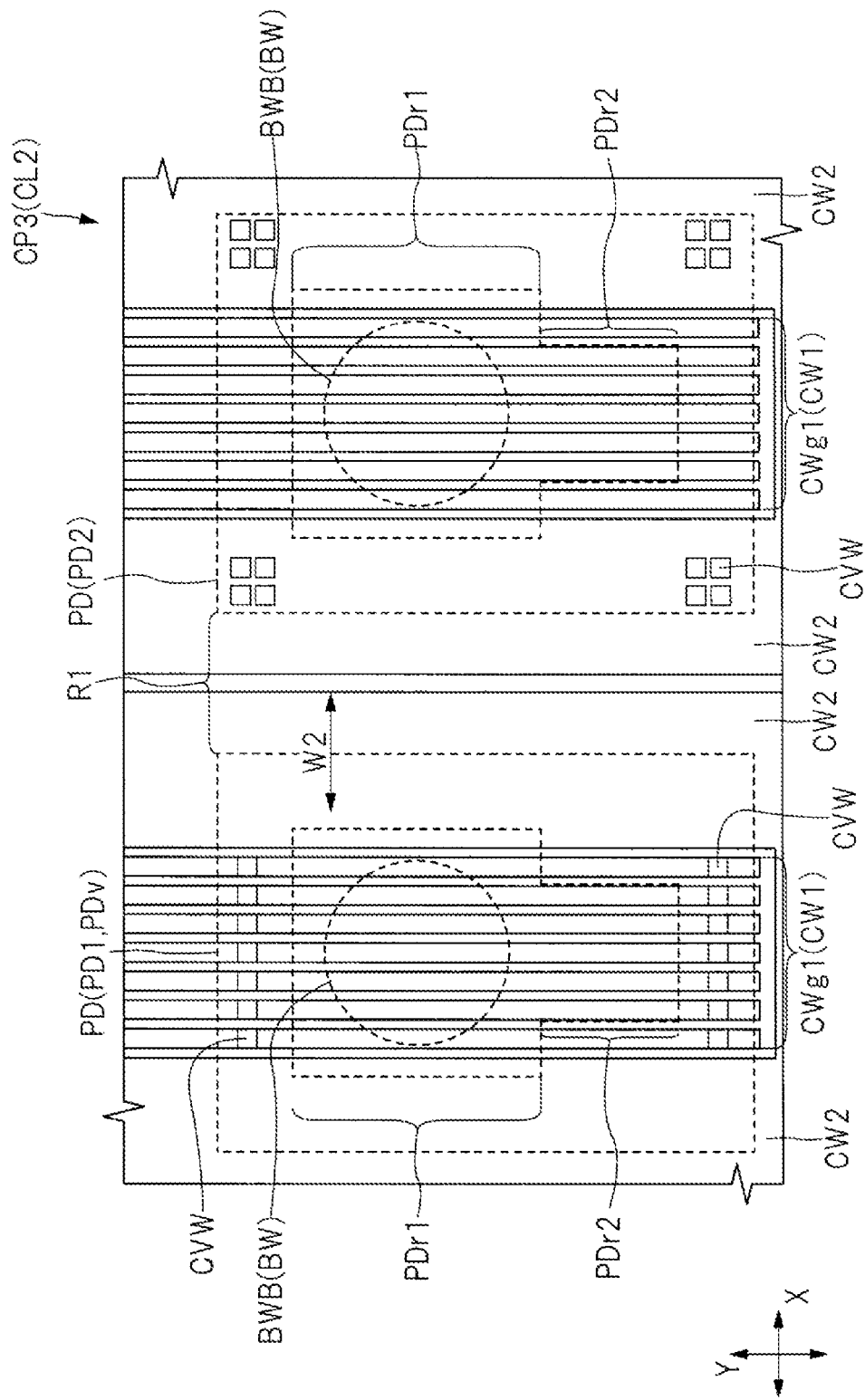
FIG. 16 is an enlarged plan view showing a modified example of FIG. 5.

FIG. 16 is an enlarged plan view showing a modified example of FIG. 5. In FIG. 16, in order to clarify the positional relationship in plan view between the ball portion BWB joined to the plurality of wirings CW1 and the bonding region PDr1, the contour of the bonding pad PD shown in FIG. 4, the contour of the opening PVk, and the contour of the ball portion BWB is shown by a dotted line.

The semiconductor chip CP3 shown in FIG. 16, in a transparent plan view, differs from the semiconductor chip CP shown in FIG. 5 in that a portion of the wiring CW2 overlaps a portion of the bonding pad PD. In the example shown in FIG. 16, each of the plurality of interconnects CW2 overlaps either the bonding pad PD1 or the bonding pad PD2. However, each of the plurality of second wirings CW2, of each of the bonding pad PD1 and the bonding pad PD2, the ball portion (conductive member) BWB does not overlap the region to be bonded.

From the viewpoint of suppressing damage to the wiring CW2 and its peripheral member, as shown in FIG. 5, a plurality of wirings CW2, it is particularly preferable that the bonding region PDr1 of the bonding pad PD exposed from the insulating film (protective film) PV do not overlap. However, since the bonding region PDr1 is a region to which the ball portion BWB is to be bonded, there is a certain margin. Consequently, if the ball portion BWB and the wiring CW2 overlap, it is possible to prevent damaging the wiring CW2. Therefore, as long as the ball portion BWB and the wiring CW2 does not overlap as shown in FIG. 16, even when the wiring CW2 and the bonding pads PD are slightly bulky is allowed.

The semiconductor chip CP3 shown in FIG. 16, except for the difference described above, is the same as the semiconductor chip CP shown in FIG. Therefore, duplicate descriptions are omitted.

Although the invention made by the present inventor has been specifically described based on the embodiment, the present invention is not limited to the above embodiment, and it is needless to say that various modifications can be made without departing from the gist thereof.

What is claimed is:

1. A semiconductor device comprising:
    a semiconductor substrate having a main surface having a first side extended in a first direction;
    a plurality of wiring layers stacked on the main surface of the semiconductor substrate;
    a protective film covering a first wiring layer of the plurality of wiring layers, the first wiring being provided at an uppermost layer of the plurality of wiring layers;
    a plurality of bonding pads formed in the first wiring layer;
    a plurality of first wirings formed in a second wiring layer provided on one layer below the first wiring layer, wherein a power supply potential is to be supplied to each of the plurality of first wirings; and
    one or more second wirings formed in the second wiring layer, wherein a reference potential is to be supplied to the one or more second wirings,
    wherein each of the plurality of bonding pads has a bonding region exposed from the protective film at an opening formed in the protective film,
    wherein the plurality of bonding pads includes a first bonding pad and a second bonding pad that are arranged along the first side of the main surface,
    wherein, in transparent plan view seen from an upper surface side of the protective film:
        each of the plurality of first wirings is arranged next to each other, and is arranged such that each of the plurality of first wirings is extended in a second direction at a first position of the second wiring layer, the second direction crossing the first direction, the first position being overlapped with the bonding region of the first bonding pad; and
        the one or more second wirings are arranged such that the one or more second wirings are extended along one of the plurality of first wirings at a second position of the second wiring layer, the second position being overlapped with a first region located between the first bonding pad and the second bonding pad, and
    wherein a width of each of the plurality of first wirings is less than a width of the one or more second wirings.

2. The semiconductor device according to claim 1,
    wherein the second wirings each extended along the one of the plurality of first wirings are formed in the second wiring layer, and
    wherein the plurality of first wirings arranged next to each other is located between the second wirings.

3. The semiconductor device according to claim 2, wherein, in transparent plan view:
    the plurality of first wirings is arranged at each of the first position overlapped with the bonding region of the first bonding pad and a third position overlapped with the bonding region of the second bonding pad, and
    the second wirings each extended along the one of the plurality of first wirings are arranged at both sides of the bonding region of the first bonding pad and both sides of the bonding region of the second bonding pad, respectively.

4. The semiconductor device according to claim 3,
    wherein the first bonding pad is electrically connected with each of the plurality of first wirings arranged at the first position overlapped with the bonding region of the first bonding pad, and
    wherein the second bonding pad is electrically connected with the second wiring, and is electrically separated from the plurality of first wirings arranged at the third position overlapped with the bonding region of the second bonding pad.

5. The semiconductor device according to claim 4,
    wherein the plurality of wiring layers includes a third wiring layer provided on one layer below the second wiring layer,
    wherein a third wiring electrically connected with the plurality of first wirings is arranged in the third wiring layer, wherein the power supply potential is to be supplied to the third wiring, and wherein the third wiring extends along the first side so as to cross each of the plurality of first wirings and the second wiring in transparent plan view, and
    wherein each of the plurality of first wirings arranged at each of the first position overlapped with the bonding region of the first bonding pad and the third position overlapped with the bonding region of the second bonding pad is electrically connected with each other via the third wiring.

6. The semiconductor device according to claim 2, wherein the plurality of wiring layers includes a third wiring layer provided on one layer below the second wiring layer, and
wherein the third wiring layer includes:
a third wiring electrically connected with the plurality of first wirings, wherein the power supply potential is to be supplied to the third wiring, and wherein the third wiring extends along the first side so as to cross each of the plurality of first wirings and the second wirings in transparent plan view; and
a fourth wiring electrically connected with the second wirings, wherein the reference potential is to be supplied to the fourth wiring, and wherein the fourth wiring extends along the first side so as to cross each of the plurality of first wirings and the second wirings in transparent plan view.

7. The semiconductor device according to claim 6, wherein a width of the third wiring and a width of the fourth wiring are larger than the width of each of the plurality of first wirings.

8. The semiconductor device according to claim 1, wherein the plurality of bonding pads includes:
a plurality of first row pads including the first bonding pad and the second bonding pad, and arranged along the first side; and
a plurality of second row pads arranged far away from the first side than the plurality of first row pads.

9. The semiconductor device according to claim 8, wherein the second wirings each extended along the one of the plurality of first wirings are formed in the second wiring layer,
wherein the plurality of first wirings arranged next to each other is located between the second wirings,
wherein the plurality of wiring layers includes a third wiring layer provided on one layer below the second wiring layer, and
wherein the third wiring layer includes:
a fourth wiring electrically connected with the second wirings, wherein the reference potential is to be supplied to the fourth wiring, wherein the fourth wiring extends along the first side so as to cross each of the plurality of first wirings and the second wirings in transparent plan view, and wherein the fourth wiring is overlapped with the plurality of first row pads; and
a fifth wiring electrically connected with the second wirings, wherein the reference potential is to be supplied to the fifth wiring, wherein the fifth wiring extends along the first side so as to cross each of the plurality of first wirings and the second wirings in transparent plan view, and wherein the fifth wiring is overlapped with the plurality of second row pads.

10. The semiconductor device according to claim 9, wherein a width of the fourth wiring and a width of the fifth wiring are larger than the width of each of the plurality of first wirings.

11. The semiconductor device according to claim 10, wherein the plurality of second row pads includes a third bonding pad electrically connected with the first bonding pad via the plurality of first wirings, and
wherein, in transparent plan view, each of the plurality of first wirings extends in the second direction so as to overlap with the bonding region of the first bonding pad and the bonding region of the third bonding pad.

12. The semiconductor device according to claim 10, wherein, in transparent plan view, each of the plurality of first wirings is arranged so as to overlap with the bonding region of the first bonding pad, but so as not to overlap with the plurality of second row pads.

13. The semiconductor device according to claim 8, wherein each of the plurality of first wirings arranged at the first position overlapped with the bonding region of the first bonding pad is electrically connected with one of the first bonding pad and the plurality of second row pads.

14. The semiconductor device according to claim 1, wherein a distance between the plurality of first wirings arranged next to each other is equal to or less than the width of each of the plurality of first wirings.

15. The semiconductor device according to claim 1,
wherein the width of each of the plurality of first wirings is 1.0 µm or less, and
wherein a distance between the plurality of first wirings is 0.55 µm or less.

16. The semiconductor device according to claim 1, wherein, in transparent plan view, the second wiring is overlapped with at least one of the first bonding pad and the second bonding pad, and is not overlapped with the bonding region of each of the first bonding pad and the second bonding pad.

17. The semiconductor device according to claim 1,
wherein a conductive member is connected to each of the first bonding pad and the second bonding pad, and
wherein, in transparent plan view, the second wiring is overlapped with at least one of the first bonding pad and the second bonding pad, and is not overlapped with a contact surface of the conductive member connected to each of the first bonding pad and the second bonding pad.

18. A semiconductor device comprising:
a semiconductor substrate having a main surface;
a plurality of wiring layers stacked on the main surface of the semiconductor substrate; and
a protective film covering the plurality of wiring layers,
wherein a first wiring layer of the plurality of wiring layers includes a plurality of bonding pads, the first wiring being provided at an uppermost layer of the plurality of wiring layers,
wherein each of the plurality of bonding pads has a bonding region,
wherein the bonding region is exposed from the protective film at an opening formed in the protective film,
wherein a second wiring layer of the plurality of wiring layers, which is provided on one layer below the first wiring layer, includes:
a plurality of first wirings located at a first region overlapped with the bonding region in transparent plan view seen from an upper surface side of the protective film; and
a plurality of second wirings located at a second region not overlapped with the bonding region in transparent plan view seen from the upper surface side of the protective film,
wherein a width of each of the plurality of first wirings is less than a width of each of the plurality of second wirings,
wherein a distance between the plurality of first wirings arranged next to each other is equal to or less than the width of each of the plurality of first wirings, wherein a power supply potential is to be supplied to each of the plurality of first wirings, and wherein a reference potential is to be supplied to each of the plurality of second wirings.

19. The semiconductor device according to claim 18,
wherein the plurality of bonding pads has the bonding region and a probe region,
wherein the bonding region and the probe region are exposed from the protective film at the opening formed in the protective film, and
wherein the second wiring layer includes:
  the plurality of first wirings located at the first region overlapped with each of the bonding region and the probe region in transparent plan view seen from the upper surface side of the protective film; and
  the plurality of second wirings located at the second region not overlapped with each of the bonding region and the probe region in transparent plan view seen from the upper surface side of the protective film.

20. The semiconductor device according to claim 19,
wherein the main surface of the semiconductor substrate has a first side extended in a first direction,
wherein a third wiring layer of the plurality of wiring layers, which is provided on one layer below the second wiring layer, includes:
  a third wiring extended along the first side in transparent plan view seen from the upper surface side of the protective film, wherein the power supply potential is to be supplied to the third wiring;
  a fourth wiring extended along the first side in transparent plan view seen from the upper surface side of the protective film, wherein the reference potential is to be supplied to the fourth wiring; and
  a fifth wiring extended along the first side in transparent plan view seen from the upper surface side of the protective film, wherein the reference potential is to be supplied to the fifth wiring,
wherein, in transparent plan view seen from the upper surface side of the protective film, the third wiring is arranged between the fourth wiring and the fifth wiring,
wherein a width of each of the plurality of first wirings and a width of a wiring included in a wiring layer located below the third wiring layer are less than each of a width of each of the plurality of second wirings, a width of the third wiring, a width of the fourth wiring and a width of the fifth wiring,
wherein, in transparent plan view seen from the upper surface side of the protective film, each of the plurality of second wirings extends in a second direction crossing the first direction, and
wherein the fourth wiring is electrically connected with the fifth wiring via at least one of the plurality of second wirings.

21. The semiconductor device according to claim 20,
wherein the plurality of bonding pads includes:
  a plurality of first row pads arranged along the first side; and
  a plurality of second row pads arranged along the first side, and arranged far away from the first side than the plurality of first row pads,
wherein the plurality of first row pads includes:
  a first bonding pad electrically connected with each of the plurality of first wirings; and
  a second bonding pad electrically connected with at least one of the plurality of second wirings, and
wherein the plurality of second row pads includes:
  a third bonding pad electrically connected with each of the plurality of first wirings; and
  a fourth bonding pad electrically connected with at least one of the plurality of second wirings.

22. The semiconductor device according to claim 21,
wherein the second region is a region overlapped with a region located between the plurality of first row pads arranged next to each other in transparent plan view seen from the upper surface side of the protective film, and
wherein the plurality of first wirings is connected to each other at a region in the second wiring layer, other than the first region and the second region.

23. The semiconductor device according to claim 21,
wherein the second region is a region overlapped with a region located between the plurality of first row pads arranged next to each other in transparent plan view seen from the upper surface side of the protective film, and
wherein the plurality of second wirings is connected to each other at a region in the second wiring layer, other than the first region and the second region.

* * * * *